(12) United States Patent
Urago et al.

(10) Patent No.: US 9,716,049 B2
(45) Date of Patent: Jul. 25, 2017

(54) SEMICONDUCTOR DEVICE AND MANUFACTURING METHOD OF SEMICONDUCTOR DEVICE

(71) Applicant: Socionext Inc., Yokohama-shi, Kanagawa (JP)

(72) Inventors: Kazuyuki Urago, Musashino (JP); Nobutaka Shimizu, Machida (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/813,592

(22) Filed: Jul. 30, 2015

(65) Prior Publication Data
US 2016/0035637 A1    Feb. 4, 2016

(30) Foreign Application Priority Data

Aug. 1, 2014  (JP) .................................. 2014-157625

(51) Int. Cl.
*H01L 23/053*    (2006.01)
*H01L 23/498*    (2006.01)
(Continued)

(52) U.S. Cl.
CPC ............ *H01L 23/053* (2013.01); *H01L 21/52* (2013.01); *H01L 23/04* (2013.01); *H01L 23/10* (2013.01);
(Continued)

(58) Field of Classification Search
CPC .................. H01L 23/053; H01L 23/04; H01L 23/39838; H01L 23/49894; H01L 21/52;
(Continued)

(56) References Cited

U.S. PATENT DOCUMENTS

| | | | | |
|---|---|---|---|---|
| 4,887,148 A | * | 12/1989 | Mu | H01L 23/42 |
| | | | | 257/664 |
| 6,665,187 B1 | * | 12/2003 | Alcoe | H01L 23/10 |
| | | | | 165/185 |

(Continued)

FOREIGN PATENT DOCUMENTS

| | | |
|---|---|---|
| JP | 2006-108162 A | 4/2006 |
| JP | 2007-335423 A | 12/2007 |

(Continued)

OTHER PUBLICATIONS

Extended Search Report dated Nov. 5, 2015, issued in counterpart European Application No. 15178991.4. (5 pages).

(Continued)

*Primary Examiner* — Alexander Oscar Williams
(74) *Attorney, Agent, or Firm* — Westerman, Hattori, Daniels & Adrian, LLP

(57) ABSTRACT

A semiconductor device includes: a substrate; a semiconductor element disposed on the substrate; a plurality of electrodes disposed on the substrate separately from one another and arranged so as to surround the semiconductor element in a plan view; a lid that cover the semiconductor element, the lid including an inner portion and a periphery portion that is outer than the inner portion in a plan view, the lid including a plurality of first protruding members that is provided separately from one another, the first protruding members being disposed in the inner portion; and conductive members disposed between the plurality of electrodes and the plurality of protruding members disposed in positions opposed to the plurality of electrodes respectively, the conductive members being joined to the plurality of electrodes and the plurality of protruding members respectively.

20 Claims, 21 Drawing Sheets

(51) Int. Cl.
*H01L 21/52* (2006.01)
*H01L 23/04* (2006.01)
*H01L 23/10* (2006.01)
*H01L 23/552* (2006.01)
*H01L 23/00* (2006.01)

(52) U.S. Cl.
CPC .. H01L 23/49838 (2013.01); H01L 23/49894 (2013.01); H01L 23/552 (2013.01); *H01L 24/13* (2013.01); *H01L 24/16* (2013.01); *H01L 24/29* (2013.01); *H01L 24/32* (2013.01); *H01L 24/73* (2013.01); *H01L 24/83* (2013.01); *H01L 24/92* (2013.01); *H01L 2224/131* (2013.01); *H01L 2224/16225* (2013.01); *H01L 2224/2919* (2013.01); *H01L 2224/32225* (2013.01); *H01L 2224/32245* (2013.01); *H01L 2224/73204* (2013.01); *H01L 2224/73253* (2013.01); *H01L 2224/83191* (2013.01); *H01L 2224/92125* (2013.01); *H01L 2924/1579* (2013.01); *H01L 2924/15311* (2013.01); *H01L 2924/15787* (2013.01); *H01L 2924/1631* (2013.01); *H01L 2924/1659* (2013.01); *H01L 2924/16153* (2013.01); *H01L 2924/16235* (2013.01); *H01L 2924/16251* (2013.01); *H01L 2924/16315* (2013.01); *H01L 2924/16724* (2013.01); *H01L 2924/16747* (2013.01); *H01L 2924/19041* (2013.01); *H01L 2924/19042* (2013.01); *H01L 2924/19105* (2013.01); *H01L 2924/3511* (2013.01)

(58) Field of Classification Search
CPC ................. H01L 23/10; H01L 23/552; H01L 2924/16724; H01L 22/14; H01L 24/13; H01L 24/16; H01L 24/29; H01L 24/32; H01L 24/73; H01L 24/83; H01L 24/92; H01L 2224/16225; H01L 2224/2929; H01L 2224/32225
USPC ....... 257/712, 717, 713, 707, 708, 710, 704, 257/777, 685, 686, 723, 690–694, 696, 257/698
See application file for complete search history.

(56) References Cited

U.S. PATENT DOCUMENTS

| | | | | |
|---|---|---|---|---|
| 7,557,307 B2* | 7/2009 | Nishizawa | ............... | B32B 18/00 174/377 |
| 8,338,943 B2* | 12/2012 | Loo | .......... | H01L 21/50 257/707 |
| 8,906,741 B2* | 12/2014 | Lu | .......... | H01L 23/495 257/676 |
| 8,933,560 B2* | 1/2015 | Ihara | ..................... | H01L 23/055 257/706 |
| 8,957,527 B2* | 2/2015 | Haba | ..................... | H01L 21/561 257/734 |
| 8,987,894 B2* | 3/2015 | Houle | ................. | H01L 23/3736 257/713 |
| 9,136,207 B2* | 9/2015 | Tan | ..................... | H01L 23/4951 |
| 9,190,398 B2* | 11/2015 | Tu | ............... | H01L 31/16 |
| 9,224,711 B2* | 12/2015 | Imamura | ................ | H01L 24/81 |
| 9,287,194 B2* | 3/2016 | Hung | ..................... | H01L 23/48 |
| 2007/0221399 A1 | 9/2007 | Nishizawa et al. | | |
| 2007/0252655 A1* | 11/2007 | Moriya | .................... | H03B 5/36 331/158 |
| 2008/0017975 A1* | 1/2008 | Deppisch | ................ | H01L 23/42 257/706 |
| 2009/0273062 A1* | 11/2009 | Ararao | ................ | H01L 21/4878 257/660 |
| 2010/0013087 A1* | 1/2010 | England | ................. | H01L 24/19 257/700 |
| 2010/0200983 A1 | 8/2010 | Ono et al. | | |
| 2010/0308451 A1* | 12/2010 | Kodani | .................... | H01L 25/16 257/690 |
| 2011/0298109 A1* | 12/2011 | Pagaila | .................... | H01L 21/56 257/660 |
| 2012/0025366 A1 | 2/2012 | Kanaya et al. | | |
| 2012/0248553 A1* | 10/2012 | Takano | ................ | B81C 1/0023 257/415 |
| 2015/0048922 A1* | 2/2015 | Kimura | ................ | H01H 37/767 337/401 |
| 2015/0348892 A1* | 12/2015 | Kuo | ................ | H01L 23/49822 174/261 |
| 2016/0027710 A1* | 1/2016 | Xu | ............... | H01L 23/24 257/685 |

FOREIGN PATENT DOCUMENTS

| | | |
|---|---|---|
| JP | 2010-16030 A | 1/2010 |
| WO | 92/20096 A1 | 11/1992 |

OTHER PUBLICATIONS

Extended Search Report dated May 11, 2015, issued in counterpart European Application No. 15178991.4. (5 pages).

* cited by examiner

OCCURRENCE OF SEPARATION AND CRACKING

OCCURRENCE OF SEPARATION AND CRACKING

FIG.28

| DETAILS OF EVALUATION | CONTINUITY CHECK ||
|---|---|---|
| | ROOM TEMPERATURE (RT) ||
| EVALUATION SAMPLE | 1000 CYCLES | 2000 CYCLES |
| STRUCTURE A | GOOD | NO GOOD |
| STRUCTURE B | GOOD | GOOD |
| DETAILS OF EVALUATION | CROSS-SECTIONAL OBSERVATION ||
| EVALUATION SAMPLE | 1000 CYCLES | 2000 CYCLES |
| STRUCTURE A | NO GOOD | NO GOOD |
| STRUCTURE B | GOOD | GOOD |

SEMICONDUCTOR DEVICE AND MANUFACTURING METHOD OF SEMICONDUCTOR DEVICE

CROSS-REFERENCE TO RELATED APPLICATIONS

This application is based upon and claims the benefit of prior Japanese Patent Application No. 2014-157625 filed on Aug. 1, 2014, the entire contents of which are incorporated herein by reference.

FIELD

Embodiments relate to a semiconductor device and a manufacturing method of the semiconductor device.

BACKGROUND

In recent years, flip-chip bonding has been practiced in order to deal with the speeding up of electronic apparatus, such as computers. In flip-chip bonding, electrodes (connecting terminals) provided on a semiconductor chip and electrodes provided on a package board are connected to directly join the semiconductor chip face-down to the package board. One example of a semiconductor package in which the semiconductor chip is mounted on the package board by means of flip-chip bonding includes an FCBGA (Flip Chip Ball Grid Array). [Patent document 1] Japanese Laid-open Patent Publication No. 2006-108162 [Patent document 2] Japanese Laid-open Patent Publication No. 2007-335423 [Patent document 3] Japanese Laid-open Patent Publication No. 2010-016030

SUMMARY

A semiconductor device according to one aspect of the embodiments is provided with a substrate; a substrate; a semiconductor element disposed on the substrate; a plurality of electrodes disposed on the substrate separately from one another and arranged so as to surround the semiconductor element in a plan view; a lid that cover the semiconductor element, the lid including an inner portion and a periphery portion that is outer than the inner portion in a plan view, the lid including a plurality of first protruding members that is provided separately from one another, the first protruding members being disposed in the inner portion; and conductive members disposed between the plurality of electrodes and the plurality of protruding members disposed in positions opposed to the plurality of electrodes respectively, the conductive members being joined to the plurality of electrodes and the plurality of protruding members respectively.

The aspect and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF THE DRAWINGS

FIG. 28 is a tabular view indicating evaluation results.

DESCRIPTION OF EMBODIMENTS

In the FCBGA, a lid (cap) provided on the package board is brought into contact with the back side of the semiconductor chip to transfer heat generated in the semiconductor chip to the lid. In addition, for example, in FCBGAs for use in noise-sensitive products, such as high-speed networking equipment, electrode pads provided on a package board and a lid are ground-connected through conductive members in some cases, in order to reduce noise and improve electrical characteristics.

Figure 1:
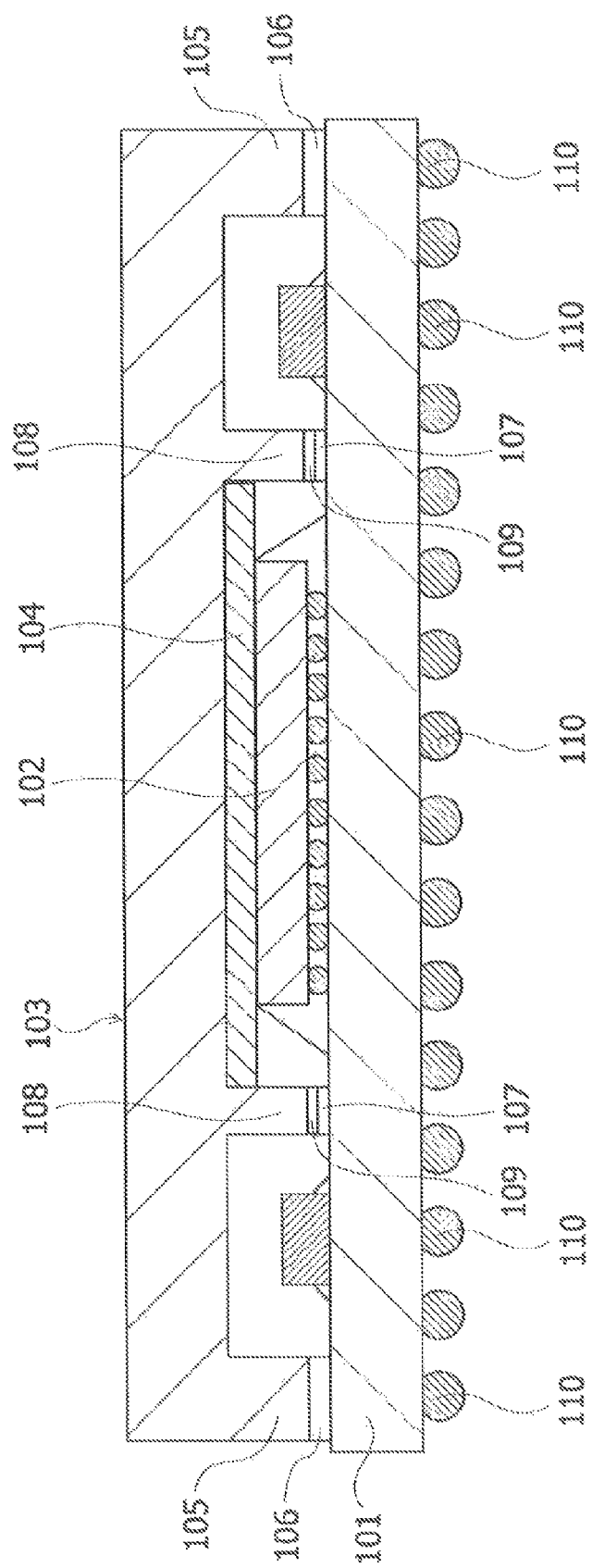
FIG. 1 is a cross-sectional view illustrating the structure of a conventional FCBGA.

FIG. 1 is a schematic view of the cross-sectional structure of a conventional FCBGA. As illustrated in FIG. 1, a semiconductor chip 102 is flip-chip bonded onto a package board 101, and a lid 103 is provided on the package board 101, so as to cover the semiconductor chip 102. The semiconductor chip 102 and the lid 103 have thermal contact with each other through a TIM (Thermal Interface Material) member 104 provided on the back side of the semiconductor chip 102 to transfer heat generated in the semiconductor chip 102 to the lid 103.

A conductive member 109 is disposed between each electrode pad 107 provided on the package board 101 and each protruding member 108 formed on the inner side of the outer periphery of the lid 103. Each electrode pad 107 is electrically connected to a solder ball 110 through a wiring line in the package board 101. The surroundings of the semiconductor chip 102 are electromagnetically shielded by connecting the lid 103, the electrode pads 107 and the conductive members 109 to a ground (GND).

Figure 2:
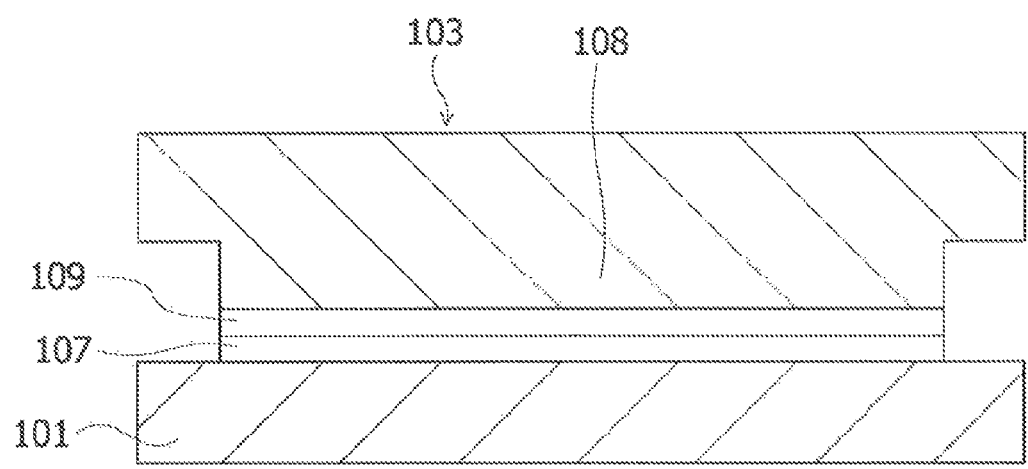
FIG. 2 is an enlarged cross-sectional view illustrating a structure of junction between a package board and a lid.
Figure 3A:
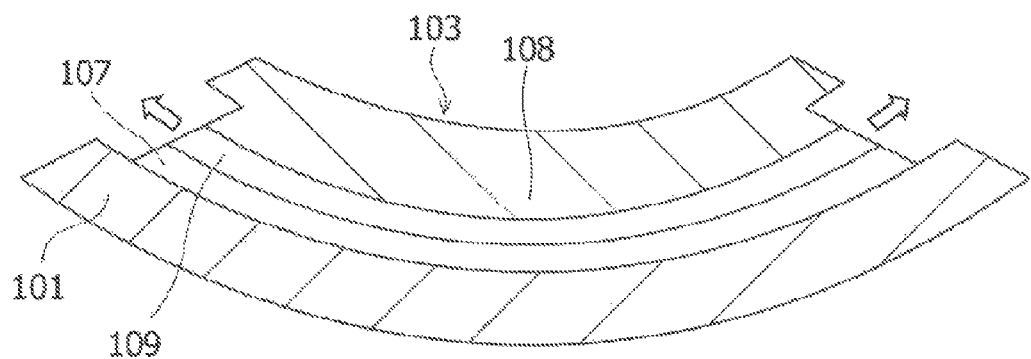
FIG. 3A is an enlarged cross-sectional view illustrating a structure of junction between the package board and the lid.
Figure 3B:
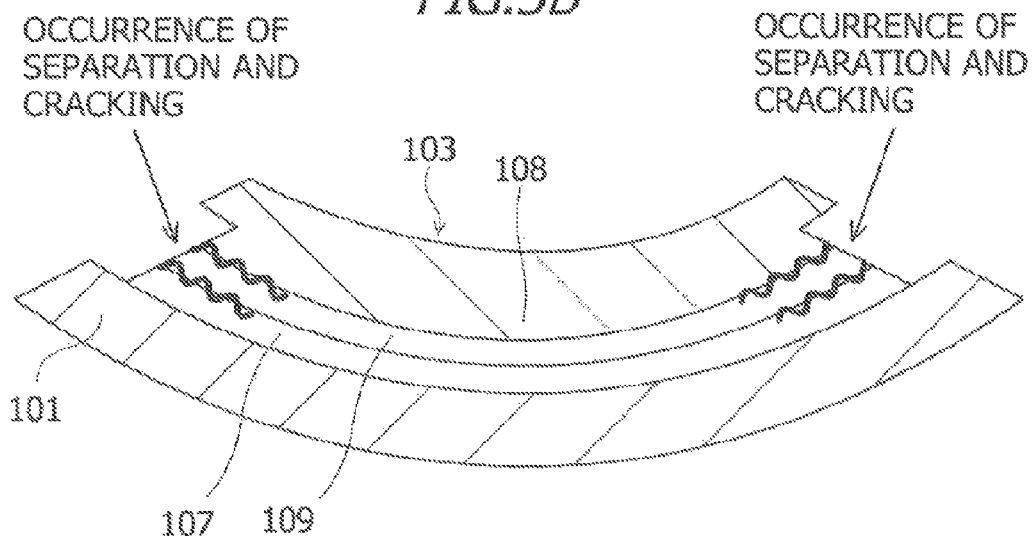
FIG. 3B is an enlarged cross-sectional view illustrating a structure of junction between the package board and the lid.

FIG. 2 is an enlarged cross-sectional view illustrating a structure of junction between the package board 101 and the lid 103. The conductive member 109 is joined to the electrode pad 107 and the protruding member 108 of the lid 103. The materials of the package board 101 and the lid 103 differ in thermal expansion coefficient. Since the materials different in thermal expansion coefficient are joined to each other through the electrode pad 107, the protruding member 108 and the conductive member 109, warpage occurs in the package board 101 and the lid 103 due to temperature changes, as illustrated in FIG. 3A. Also since the materials different in thermal expansion coefficient are joined to each other, stress and strain occur in the electrode pad 107, the lid 103, the protruding member 108 and the conductive member 109 due to temperature changes. Stress and strain become higher in locations closer to edges of the conductive member 109. Accordingly, separation between the protruding member 108 of the lid 103 and the conductive member 109, separation between the electrode pad 107 and the conductive member 109, and cracking in the conductive member 109 are liable to occur, as illustrated in FIG. 3B.

Hereinafter, a semiconductor device and a manufacturing method of the semiconductor device according to embodiments will be described with reference to the accompanying drawings. The configurations of first and second embodiments to be discussed hereinafter are merely illustrative, and therefore, the semiconductor device and the manufacturing method of the semiconductor device according to embodiments are not limited to the configurations of the first and second embodiments.

First Embodiment

Figure 4:
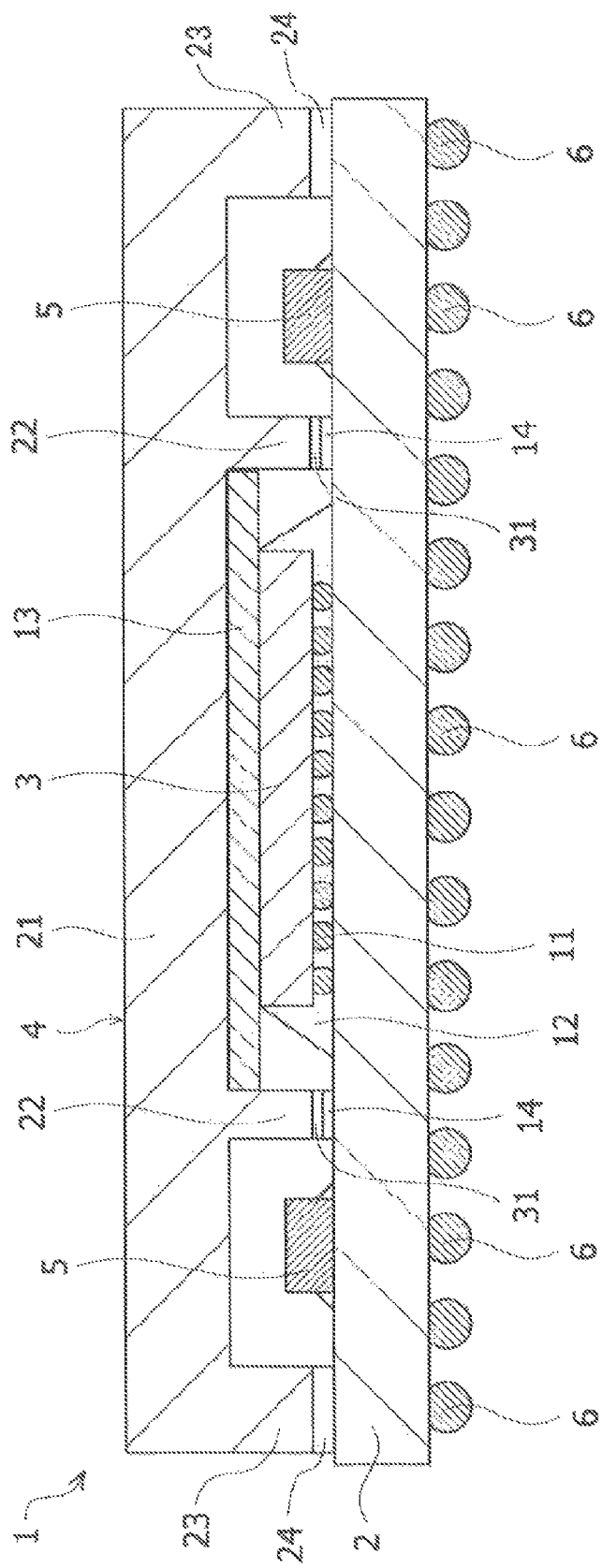
FIG. 4 is a cross-sectional view illustrating a semiconductor device.

A semiconductor device 1 according to the first embodiment will be described with reference to FIGS. 4 to 11. FIG. 4 is a cross-sectional view illustrating the semiconductor device (semiconductor package) 1. The semiconductor device 1 has an FCBGA-type package structure. The semiconductor device 1 is provided with a package board 2, a semiconductor chip 3, a lid (cap) 4, passive components 5, and solder balls 6. The package board 2 is formed using, for example, resin, such as epoxy resin, polyimide resin or phenol resin, alumina, or a material containing ceramics, such as glass ceramics. The semiconductor chip 3 is provided on the package board 2. The semiconductor chip 3 is, for example, an LSI (Large Scale Integration). The package board 2 is one example of a board. The semiconductor chip 3 is one example of a semiconductor element. The lid 4 is formed using, for example, a metal material, such as copper (Cu) or aluminum (Al). A plurality of passive components 5 is provided on the package board 2. The passive components 5 include, for example, a resistor, a capacitor and a coil. The solder balls 6 are joined to a wiring board (not illustrated), such as a mother board, to mount the semiconductor device 1 on the wiring board.

The semiconductor chip 3 is flip-chip bonded to the package board 2. That is, electrodes (not illustrated) provided on a surface of the semiconductor chip 3 on which circuits are formed (hereinafter referred to as the circuit side) and electrodes provided on the package board 2 are joined through solder balls 11 with the circuit side facing the package board 2. Underfill resin 12 is filled between the package board 2 and the semiconductor chip 3. A TIM member 13 is provided on a surface (hereinafter referred to as the back side) of the semiconductor chip 3 opposite to the circuit side. The TIM member 13 is resin having thermal conductivity. The lid 4 includes a plate-like member 21, a plurality of protruding members 22, and a sidewall member 23. The plate-like member 21, the plurality of protruding members 22, and the sidewall member 23 are metal materials containing the same metal. The plate-like member 21 covers the back side of the semiconductor chip 3 and spreads to the outer periphery of the package board 2. Each protruding member 22 protrudes toward the package board 2. An adhesive agent 24 is provided on the sidewall member 23, and the sidewall member 23 is stuck onto the package board 2 through the adhesive agent 24. The plate-like member 21 is one example of a first metal member. The protruding members 22 are one example of a second metal member. The sidewall member 23 is one example of a third metal material.

Figure 5:
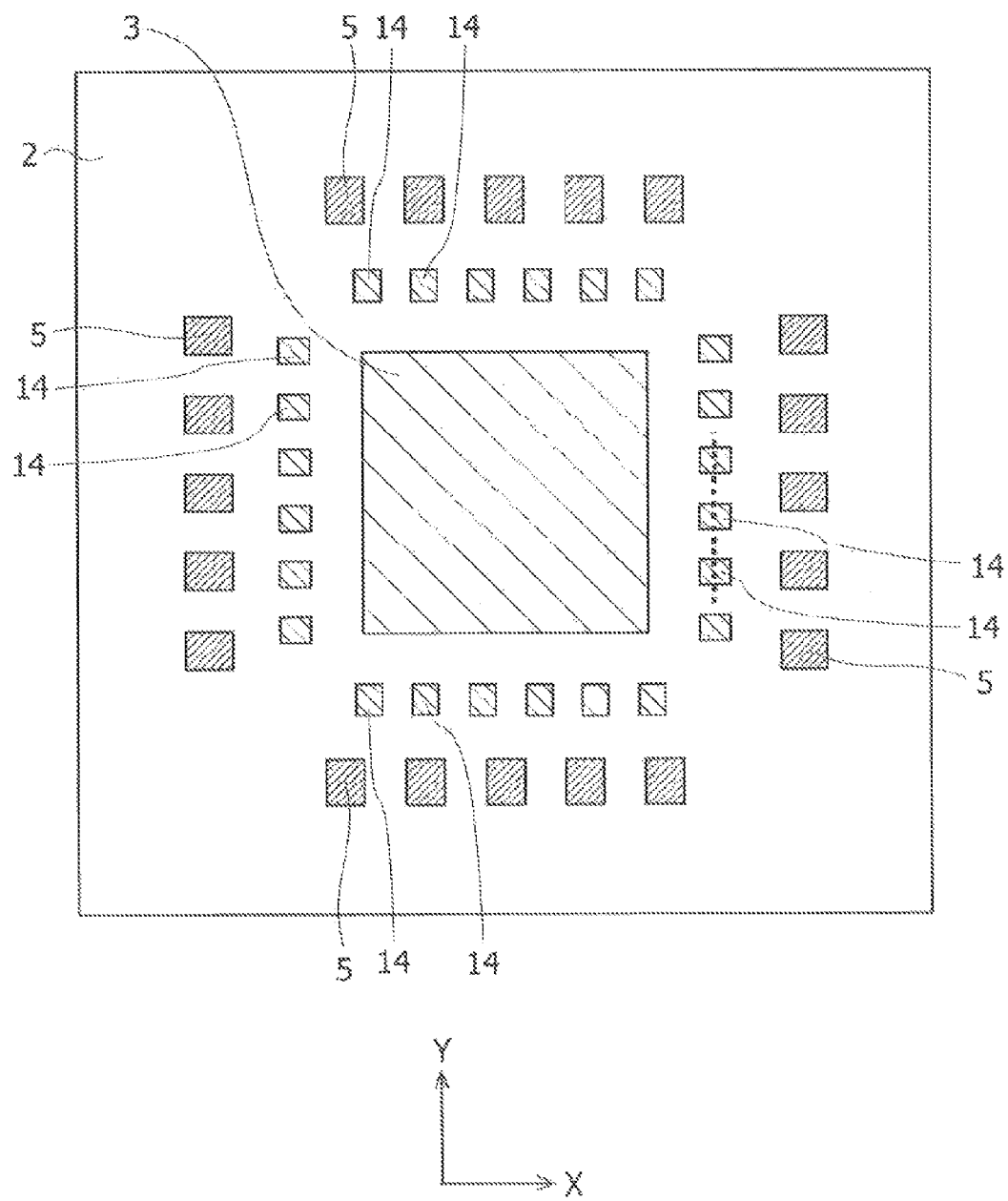
FIG. 5 is a plan view of the package board.
Figure 6:
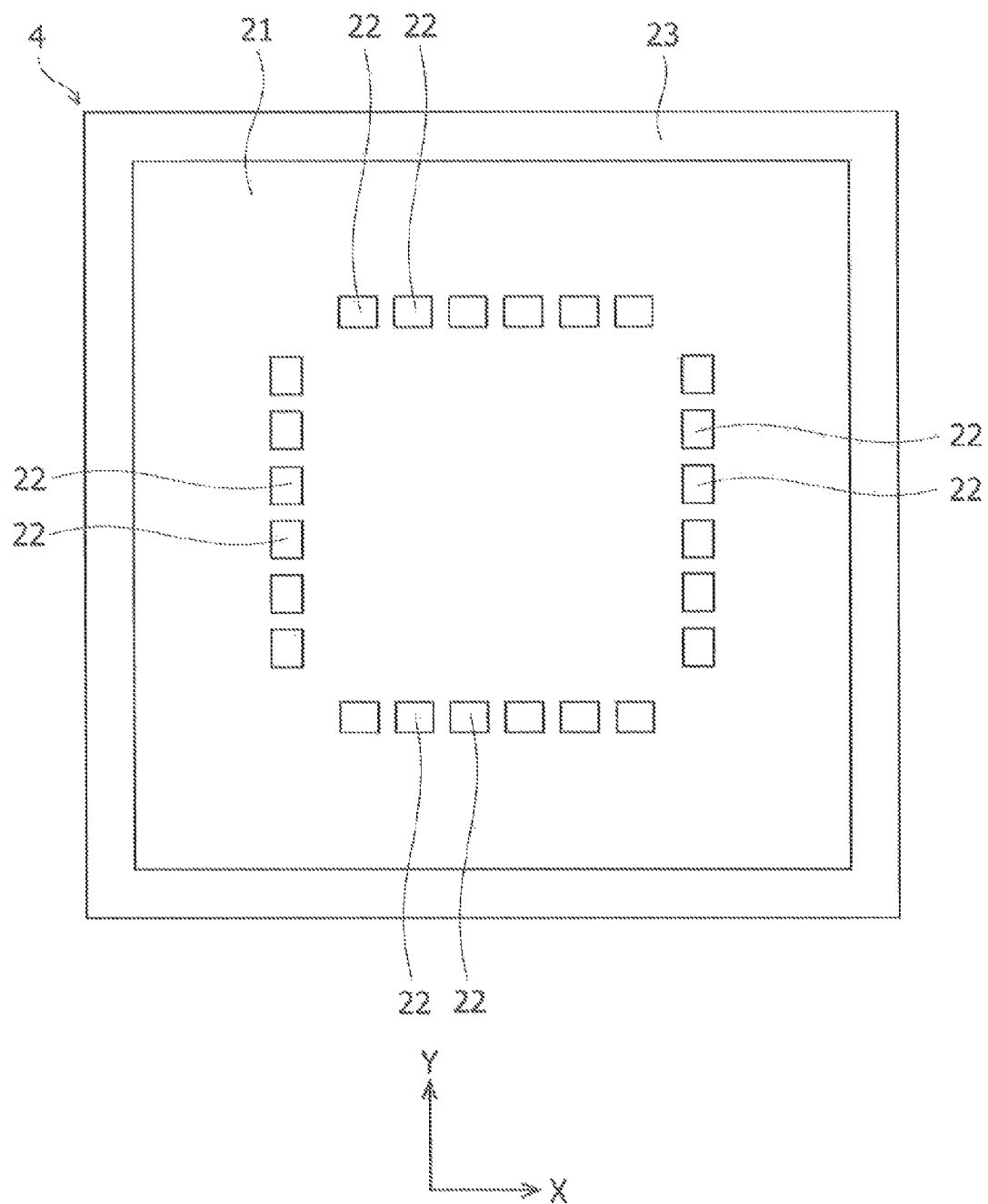
FIG. 6 is a plan view of the lid.

FIG. 5 is a plan view of the package board 2. A plurality of electrode pads 14 is provided on the package board 2 separately from one another. The electrode pads 14 are one example of an electrode. The plurality of electrode pads 14 is disposed so as to surround the semiconductor chip 3 in a plan view. The plurality of electrode pads 14 is arranged in line along the respective sides of the semiconductor chip 3 in a plan view. That is, the plurality of electrode pads 14 is arranged in line in a certain direction. In FIG. 5, the plurality of electrode pads 14 is arranged in line in an X or Y direction. FIG. 6 is a plan view of the lid 4. The plurality of protruding members 22 is formed in the plate-like member 21 separately from one another. The sidewall member 23 is disposed so as to surround the plurality of protruding members 22 in a plan view. The sidewall member 23 is formed along the outer periphery of the plate-like member 21 in a plan view. The plurality of protruding members 22 is disposed on the inner side of the outer periphery of the plate-like member 21 in a plan view. The plurality of protruding members 22 is arranged in line in a certain direction. In FIG. 6, the plurality of protruding members 22 is arranged in line in the X or Y direction. The plurality of protruding members 22 is disposed in positions opposed to the plurality of electrode pads 14. Accordingly, the plurality of protruding members 22 is arranged in line along the respective sides of the semiconductor chip 3 in a plan view. The plurality of passive components 5 is disposed between the outer periphery of the plate-like member 21 and the plurality of protruding members 22 in a plan view.

Figure 7:
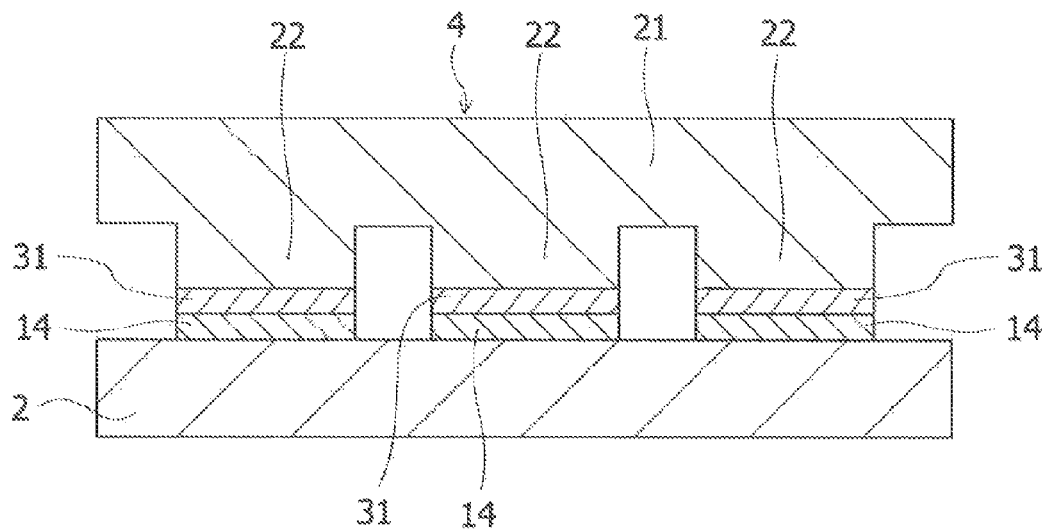
FIG. 7 is an enlarged cross-sectional view illustrating a structure of junction between the package board and each protruding member of the lid.

FIG. 7 is an enlarged cross-sectional view illustrating a structure of junction between the package board 2 and each protruding member 22 of the lid 4. The cross-sectional part of FIG. 7 corresponds to the dotted line region of FIG. 5. As illustrated in FIG. 7, the plurality of electrode pads 14 and the plurality of protruding members 22 are disposed so that each electrode pad 14 and each protruding member 22 face each other. A plurality of conductive members 31 is disposed between the plurality of electrode pads 14 and the plurality of protruding members 22. That is, each conductive member 31 is disposed between each electrode pad 14 and each protruding member 22 disposed in a position opposed to each electrode pad 14. Accordingly, the plurality of conductive members 31 is arranged in line along the respective sides of the semiconductor chip 3 in a plan view. Each conductive member 31 is joined to each electrode pad 14 and each protruding member 22. Each electrode pad 14 is electrically connected to a solder ball 6 for use as a ground terminal through a wiring line and a via provided in the package board 2. The surroundings of the semiconductor chip 3 are electromagnetically shielded by connecting the lid 4, the respective electrode pads 14 and the respective conductive members 31 to a ground (GND). The lid 4, the respective electrode pads 14 and the respective conductive members 31 may be connected to the ground by, for example, electrically connecting the solder ball 6 for use as a ground terminal and the ground electrode of the wiring board.

As illustrated in FIG. 7, the plurality of electrode pads 14 is provided on the package board 2 separately from one another, and the plurality of protruding members 22 is formed in the plate-like member 21 separately from one another. Each conductive member 31 is joined to each electrode pad 14 and each protruding member 22. Accordingly, the plurality of conductive members 31 is disposed between the plurality of electrode pads 14 and the plurality of protruding members 22 separately from one another. In this way, each electrode pad 14, each protruding member 22 and each conductive member 31 are disposed separately from one another. In other words, spaces (gaps) are respectively formed between adjacent electrode pads 14, between adjacent protruding members 22, and between adjacent conductive members 31.

Figure 8:
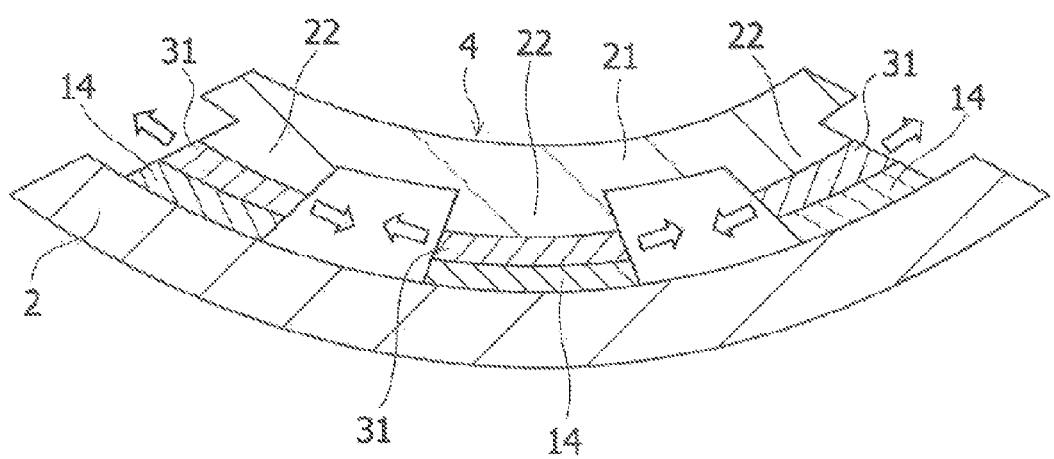
FIG. 8 is an enlarged cross-sectional view illustrating a structure of junction between the package board and each protruding member of the lid.

The package board 2 formed using resin or ceramics and the lid 4 formed using a metal material differ in thermal expansion coefficient. Since the materials different in thermal expansion coefficient are joined to each other through the electrode pads 14, the conductive members 31 and the protruding members 22, warpage occurs in the package board 2 and the lid 4 respectively due to temperature changes, as illustrated in FIG. 8. In addition, since the lid 4, the respective electrode pads 14 and the respective conductive members 31 formed using materials different in thermal expansion coefficient are joined to one another, stress and strain occur in the lid 4, the respective electrode pads 14 and the respective conductive members 31 due to temperature changes. Since each electrode pad 14, each protruding member 22 and each conductive member 31 are disposed separately from one another, stress and strain in edges of each conductive member 31 are dispersed and reduced. Accordingly, separation between each electrode pad 14 and each conductive member 31, separation between each protruding member 22 and each conductive member 31, and cracking in the conductive members 31 are reduced. As a result, it is possible to improve the reliability of the semiconductor device 1.

The plate-like member 21, the protruding members 22 and the sidewall member 23 of the lid 4 may be formed using a mold. Alternatively, the protruding members 22 and the sidewall member 23 may be formed in the plate-like member 21 by performing wet or dry etching on the plate-like member 21. Yet alternatively, the protruding members 22 and the sidewall member 23 may be formed in the plate-like member 21 by cutting the plate-like member 21.

<Manufacturing Method of Semiconductor Device 1 According to First Embodiment>

Figure 9:
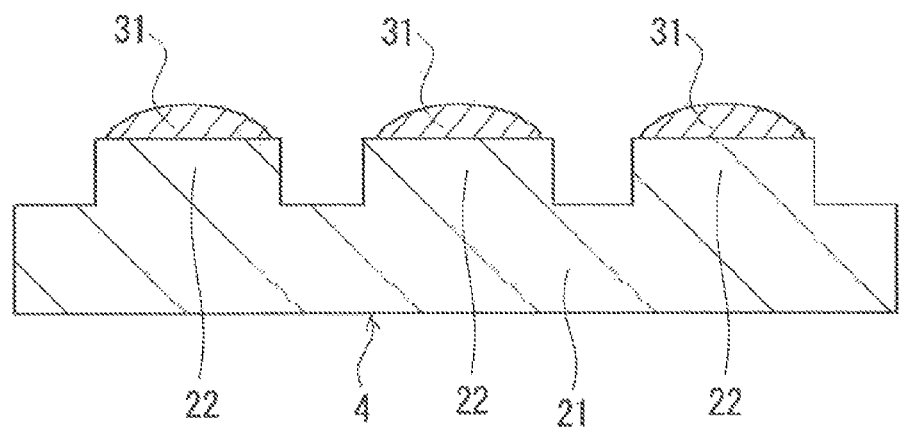
FIG. 9 is a cross-sectional view illustrating a manufacturing process of a semiconductor device according to a first embodiment.
Figure 10:
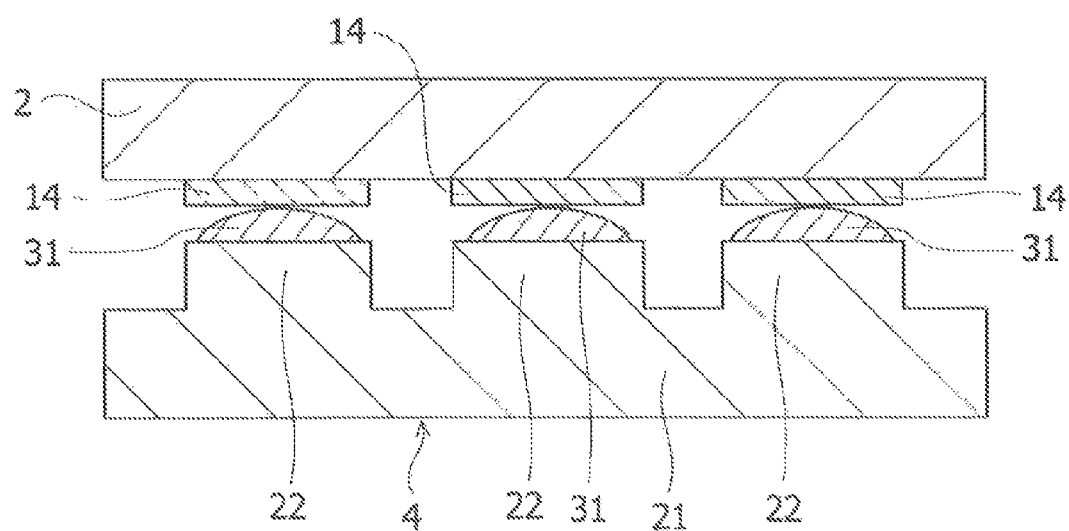
FIG. 10 is a cross-sectional view illustrating a manufacturing process of a semiconductor device according to the first embodiment.
Figure 11:
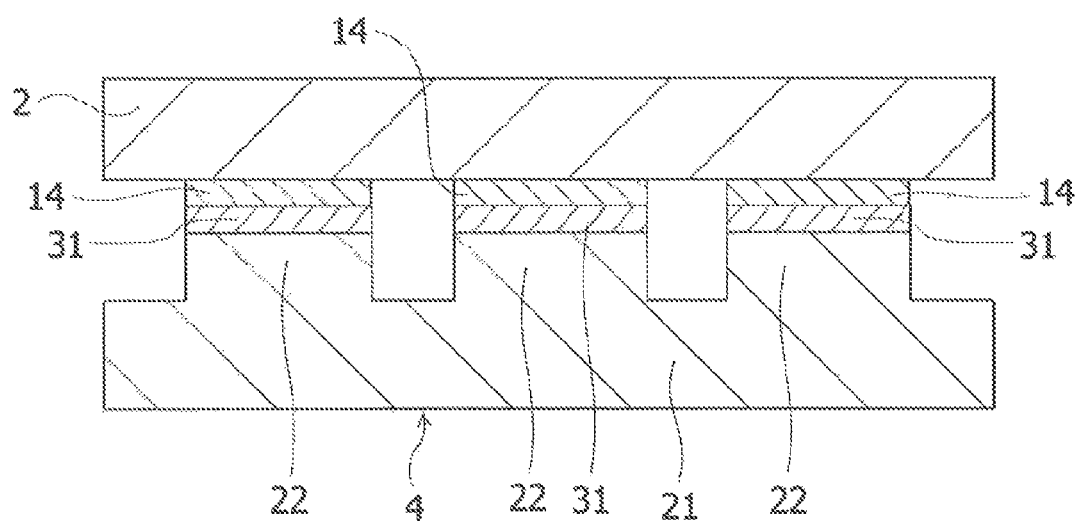
FIG. 11 is a cross-sectional view illustrating a manufacturing process of a semiconductor device according to the first embodiment.

FIGS. 9 to 11 are cross-sectional views illustrating a manufacturing process of the semiconductor device 1 according to the first embodiment. In a manufacturing method of the semiconductor device 1 according to the first embodiment, there are first prepared a package board 2 provided with a semiconductor chip 3, a plurality of electrode pads 14 and the like, and a lid 4. Next, in the step illustrated in FIG. 9, each conductive member 31 is placed on each protruding member 22 of the lid 4. When the conductive member 31 is conductive paste, each conductive member 31 is coated on each protruding member 22. Solder paste, anisotropic conductive resin or an anisotropic conductive adhesive, for example, may be used as a material of the conductive paste. When the conductive member 31 is a solder ball, each conductive member 31 is placed on each protruding member 22. When the conductive member 31 is a conductive adhesive tape or a conductive adhesive seal, each conductive member 31 is stuck onto each protruding member 22.

Although in the step illustrated in FIG. 9, each conductive member 31 is placed on each protruding member 22 of the lid 4, the first embodiment is not limited to the step illustrated in FIG. 9. For example, each conductive member 31 may be placed on each electrode pad 14 on the package board 2. In this case, the package board 2 is disposed with each electrode pad 14 of the package board 2 facing up, whereas the lid 4 is disposed with each protruding member 22 of the lid 4 facing down. Alternatively, for example, each conductive member 31 may be placed on each protruding member 22 of the lid 4 and on each electrode pad 14 on the package board 2.

Subsequently, in the step illustrated in FIG. 10, the package board 2 and the lid 4 are disposed so that a plate-like member 21 of the lid 4 covers the semiconductor chip 3 and the respective electrode pads 14 on the package board 2 and the respective protruding members 22 of the lid 4 face each other. In addition, the package board 2 and the lid 4 are disposed so that the respective conductive members 31 and the respective electrode pads 14 on the package board 2 come into contact with each other. In FIG. 10, the package board 2 is disposed with each electrode pad 14 of the package board 2 facing down, whereas the lid 4 is disposed with each protruding member 22 of the lid 4 facing up. This means that no matter whether a TIM member 13 is provided on the back side of the semiconductor chip 3 or on the plate-like member 21 of the lid 4, the plate-like member 21 of the lid 4 covers the semiconductor chip 3 with the plate-like member 21 of the lid 4 and the TIM member 13 placed in contact with each other. In addition, in the step illustrated in FIG. 10, a sidewall member 23 of the lid 4 is stuck onto the package board 2 through an adhesive agent 24.

Next, in the step illustrated in FIG. 11, a joining treatment is performed to join each conductive member 31 to each electrode pad 14 of the package board 2 and each protruding member 22 of the lid 4. When the conductive member 31 is conductive paste or a solder ball, a heating treatment is performed to melt the conductive member 31, thereby joining each conductive member 31 to each electrode pad 14 and each protruding member 22. When the conductive member 31 is a conductive adhesive tape or a conductive adhesive seal, a pressurization treatment is performed to stick each conductive member 31 to each electrode pad 14 and each protruding member 22, thereby joining each conductive member 31 to each electrode pad 14 and each protruding member 22.

Second Embodiment

A semiconductor device 1 according to the second Embodiment will be described with reference to FIGS. 12 to 23. The second embodiment differs from the first embodiment in that a concave portion (recess) is formed in each protruding member 22 of the lid 4. Other constituent elements, such as the package board 2, the semiconductor chip 3, the passive components 5 and the solder balls 6, are the same as those in the first embodiment, and therefore, will not be described here. The semiconductor device 1 according to the first embodiment and the manufacturing method thereof and the semiconductor device 1 according to the second embodiment and the manufacturing method thereof may be combined with each other as appropriate.

Figure 12:
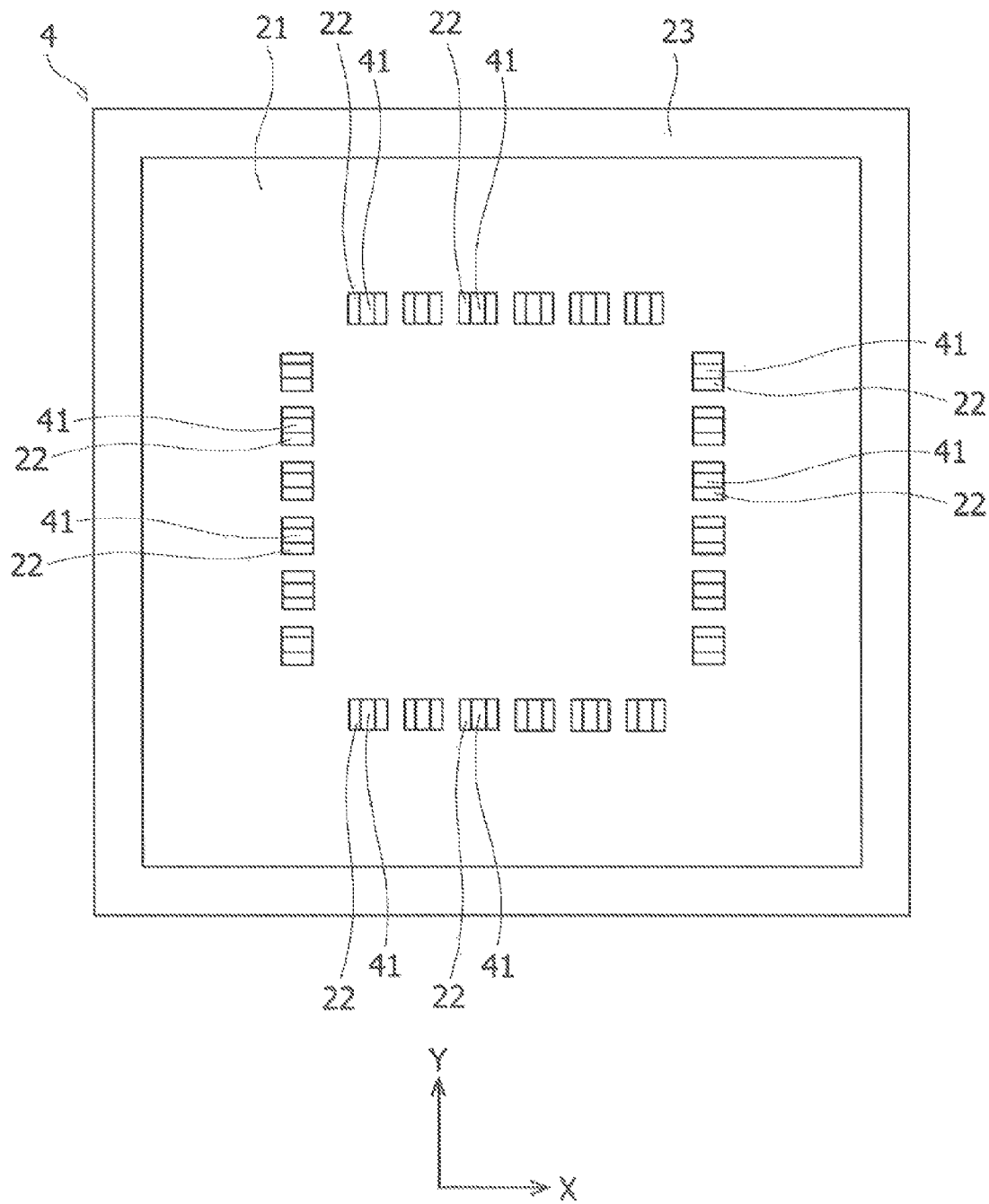
FIG. 12 is a plan view of the lid.

FIG. 12 is a plan view of the lid 4. A plurality of protruding members 22 is formed in the plate-like member 21 separately from one another. The sidewall member 23 is formed along the outer periphery of the plate-like member 21. The plurality of protruding members 22 is formed on the inner side of the outer periphery of the plate-like member 21. The plurality of protruding members 22 is arranged in line in a certain direction. In FIG. 12, the plurality of protruding members 22 is arranged in line in the X or Y direction. The plurality of protruding members 22 is disposed in positions opposed to the plurality of electrode pads 14. Accordingly, the plurality of protruding members 22 is arranged in line along the respective sides of the semiconductor chip 3. A concave portion (recess) 41 is formed in each protruding member 22. The extending direction of each concave portion 41 is orthogonal to the direction in which the plurality of protruding members 22 is arranged in line. For example, some of the plurality of protruding members 22 are arranged in line in the X direction, and the extending direction of the respective concave portions 41 formed in the plurality of protruding members 22 arranged in line in the X direction is the Y direction orthogonal to the X direction.

Figure 13:
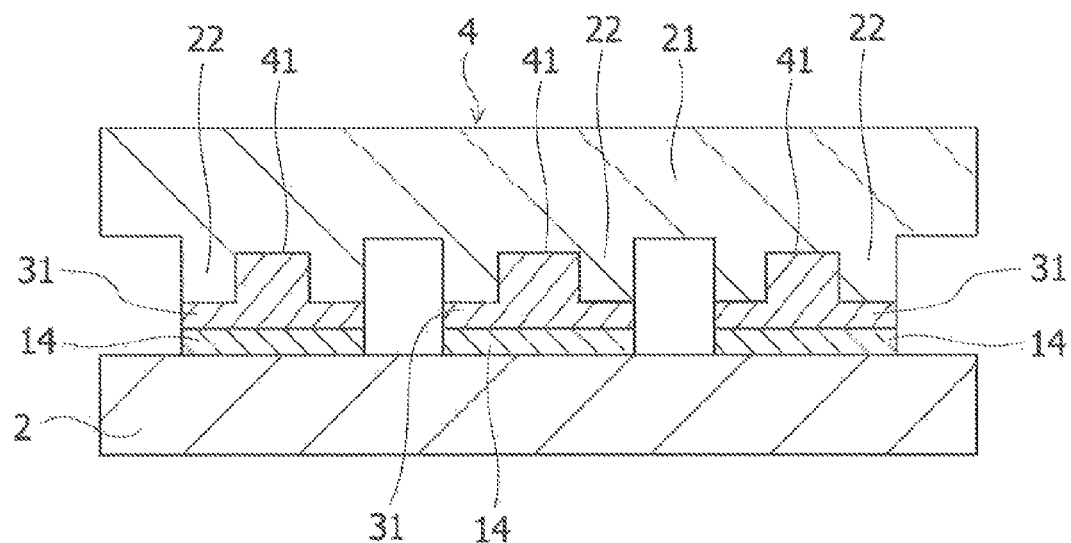
FIG. 13 is a cross-sectional view illustrating a manufacturing process of a semiconductor device according to the first embodiment.

FIG. 13 is an enlarged cross-sectional view illustrating a structure of junction between the package board 2 and each protruding member 22 of the lid 4. The cross-sectional part of FIG. 13 corresponds to the dotted line region of FIG. 5, as in the first embodiment. As illustrated in FIG. 13, the concave portion 41 is formed in each protruding member 22 of the lid 4. The plurality of electrode pads 14 and the plurality of protruding members 22 are disposed so that the respective electrode pads 14 and the respective protruding members 22 face each other. Accordingly, the concave portion 41 is formed in a surface of each protruding member 22 opposed to each electrode pad 14.

Each conductive member 31 is buried in each concave portion 41. In other words, each conductive member 31 includes a convex portion. Accordingly, an area of junction between (an area of contact between) each protruding member 22 and each conductive member 31 is increased, thereby improving a strength of junction between the protruding member 22 and the conductive member 31. In addition, an anchor effect (anchor effect of irregularities) produced as the result of each conductive member 31 getting inside each concave portion 41 reduce separation between each protruding member 22 and each conductive member 31.

In the second embodiment, since each electrode pad 14, each protruding member 22 and each conductive member 31 are disposed separately from one another as in the first embodiment, stress and strain in edges of each conductive member 31 are dispersed and reduced. Accordingly, separation between each electrode pad 14 and each conductive member 31, separation between each protruding member 22 and each conductive member 31, and cracking in the conductive members 31 are reduced. As a result, it is possible to improve the reliability of the semiconductor device 1.

The plate-like member 21, the protruding members 22, the concave portions 41 and the sidewall member 23 of the lid 4 may be formed using a mold. Alternatively, the protruding members 22, the concave portions 41 and the sidewall member 23 may be formed in the plate-like member 21 by performing wet or dry etching on the plate-like member 21. Yet alternatively, the protruding members 22, the concave portions 41 and the sidewall member 23 may be formed in the plate-like member 21 by cutting the plate-like member 21.

<Manufacturing Method of Semiconductor Device 1 According to Second Embodiment>

Figure 14:
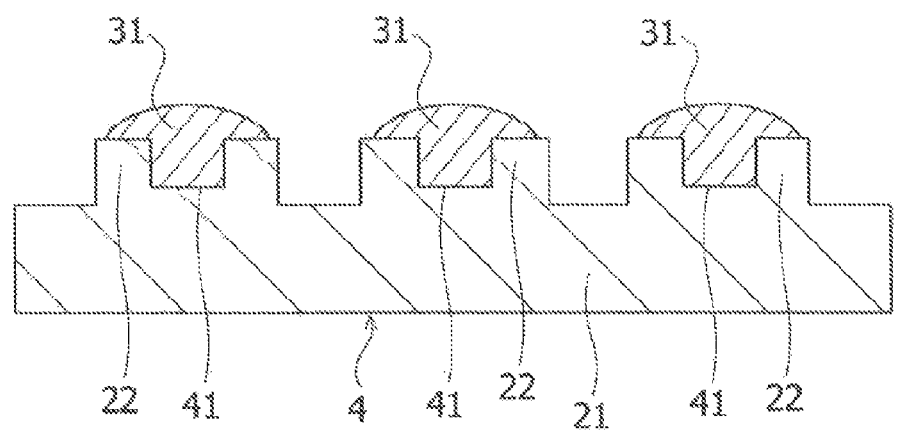
FIG. 14 is a cross-sectional view illustrating a manufacturing process of a semiconductor device according to a second embodiment.
Figure 15:
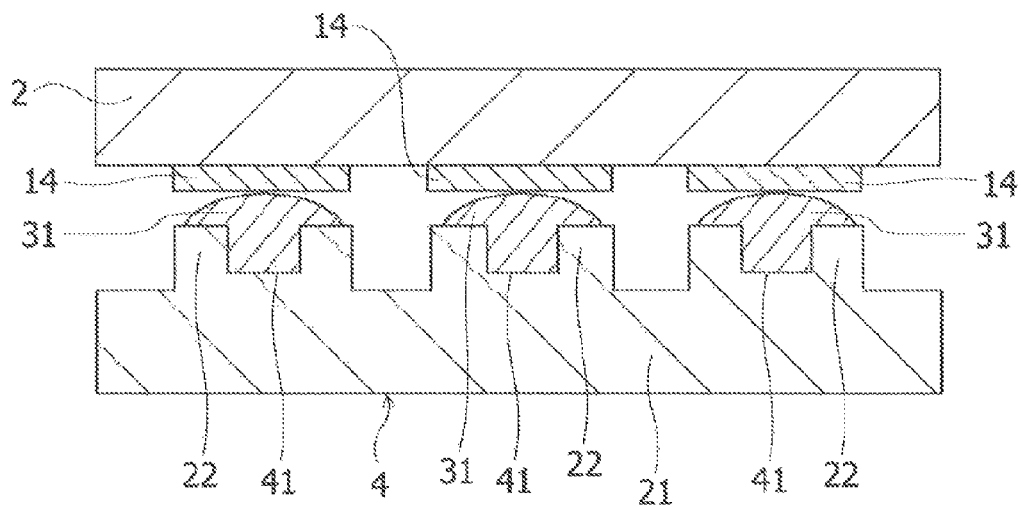
FIG. 15 is a cross-sectional view illustrating a manufacturing process of a semiconductor device according to the second embodiment.
Figure 16:
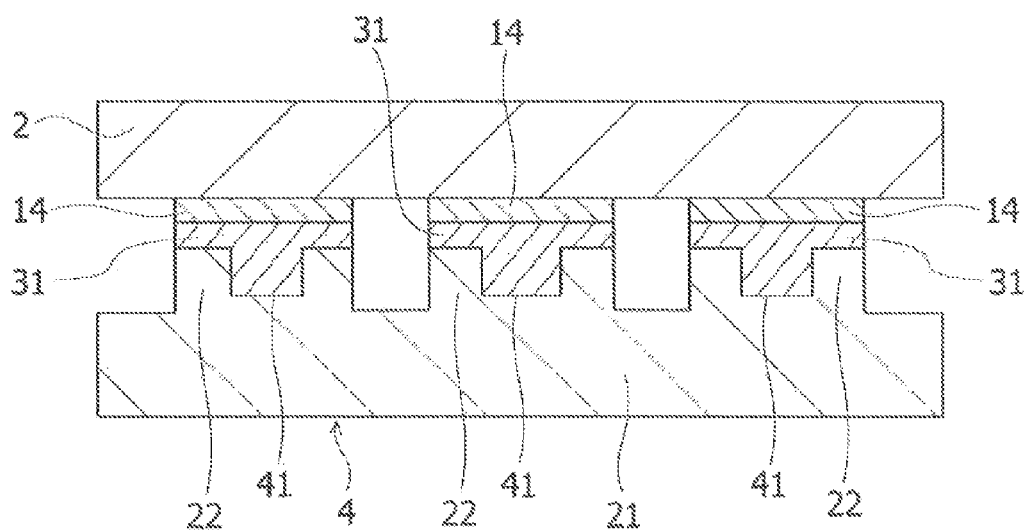
FIG. 16 is a cross-sectional view illustrating a manufacturing process of a semiconductor device according to the second embodiment.

FIGS. 14 to 16 are cross-sectional views illustrating a manufacturing process of the semiconductor device 1 according to the second embodiment. The cross-sectional parts of FIGS. 14 to 16 correspond to the dotted line region of FIG. 5, as in the first embodiment. In the manufacturing method of the semiconductor device 1 according to the second embodiment, there are first prepared a package board 2 provided with a semiconductor chip 3, a plurality of electrode pads 14 and the like, and a lid 4. Next, in the step illustrated in FIG. 14, each conductive member 31 is placed in each protruding member 22 of the lid 4. When the conductive member 31 is conductive paste, each conductive member 31 is coated on each protruding member 22, so that each conductive member 31 is buried in each concave portion 41. Since the position of each conductive member 31 is fixed as the result of being buried in each concave portion 41, displacement of each conductive member 31 is reduced.

Since the extending direction of each concave portion 41 is orthogonal to the direction in which the plurality of protruding members 22 is arranged in line, displacement of each conductive member 31 buried in each concave portion 41 in the direction the protruding members 22 arranged is reduced. Accordingly, contact of the conductive members 31 buried in adjacent concave portions 41 each other is reduced. When the conductive member 31 is a solder ball, the conductive member 31 is placed in each concave portion 41. Since the position of each conductive member 31 is fixed as the result of being placed in each concave portion 41, displacement of each conductive member 31 is reduced. When the conductive member 31 is a conductive adhesive tape or a conductive adhesive seal, the conductive member 31 is stuck onto each protruding member 22.

In the step illustrated in FIG. 14, each conductive member 31 is placed in each protruding member 22 of the lid 4. The second embodiment is not limited to the step illustrated in FIG. 14, however. For example, each conductive member 31 may be placed on each electrode pad 14 on the package board 2. In this case, the package board 2 is disposed with each electrode pad 14 of the package board 2 facing up, whereas the lid 4 is disposed with each protruding member 22 of the lid 4 facing down. Alternatively, for example, each conductive member 31 may be placed on each protruding member 22 of the lid 4 and on each electrode pad 14 on the package board 2.

Subsequently, in the step illustrated in FIG. 15, the package board 2 and the lid 4 are disposed so that a plate-like member 21 of the lid 4 covers the semiconductor chip 3 and the respective electrode pads 14 on the package board 2 and the respective protruding members 22 of the lid 4 face each other. In addition, the package board 2 and the lid 4 are disposed so that the respective conductive members 31 and the respective electrode pads 14 on the package board 2 come into contact with each other. In FIG. 15, the package board 2 is disposed with each electrode pad 14 of the package board 2 facing down, whereas the lid 4 is disposed with each protruding member 22 of the lid 4 facing up. This means that no matter whether a TIM member 13 is provided on the back side of the semiconductor chip 3 or on the plate-like member 21 of the lid 4, the plate-like member 21 of the lid 4 covers the semiconductor chip 3 with the plate-like member 21 of the lid 4 and the TIM member 13 placed in contact with each other. In addition, in the step illustrated in FIG. 15, a sidewall member 23 of the lid 4 is stuck onto the package board 2 through an adhesive agent 24.

Next, in the step illustrated in FIG. 16, a joining treatment is performed to join each conductive member 31 to each electrode pad 14 of the package board 2 and each protruding member 22 of the lid 4. When the conductive member 31 is conductive paste or a solder ball, a heating treatment is performed to melt each conductive member 31, thereby joining each conductive member 31 to each electrode pad 14 and each protruding member 22. Since the extending direction of each concave portion 41 is orthogonal to the direction in which the plurality of protruding members 22 is arranged in line, displacement of each molten conductive member 31 in each concave portion 41 in the direction the protruding members 22 arranged is reduced. Accordingly, contact of conductive members 31 buried in adjacent concave portions 41 each other is reduced.

When the conductive member 31 is a conductive adhesive tape or a conductive adhesive seal, a pressurization treatment is performed to stick each conductive member 31 to each electrode pad 14 and each protruding member 22, thereby joining each conductive member 31 to each electrode pad 14 and each protruding member 22. As the result of the pressurization treatment being performed, each conductive member 31 is buried in each concave portion 41. Since the extending direction of each concave portion 41 is orthogonal to the direction in which the plurality of protruding members 22 is arranged in line, displacement of each conductive member 31 buried in each concave portion 41 in the direction the protruding members 22 arranged is reduced. Accordingly, contact of conductive members 31 buried in adjacent concave portions 41 each other is reduced.

Figure 17:
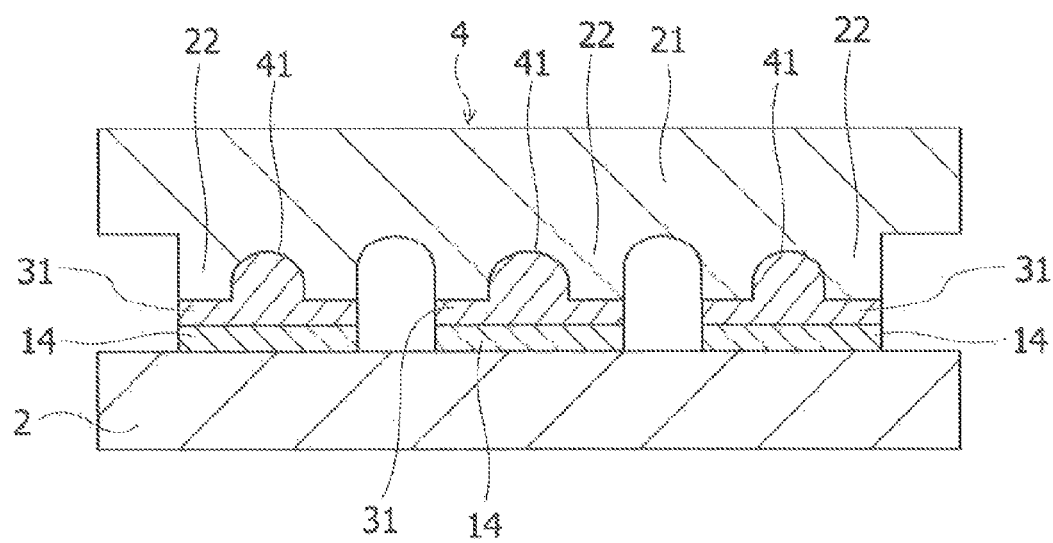
FIG. 17 is an enlarged cross-sectional view illustrating a structure of junction between the package board and each protruding member of the lid.
Figure 18:
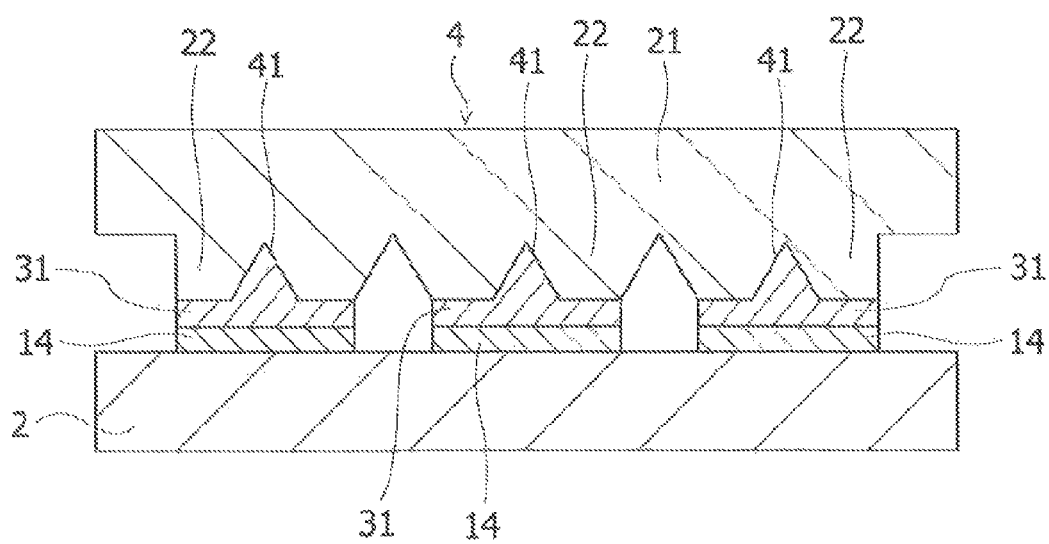
FIG. 18 is an enlarged cross-sectional view illustrating a structure of junction between the package board and each protruding member of the lid.
Figure 19:
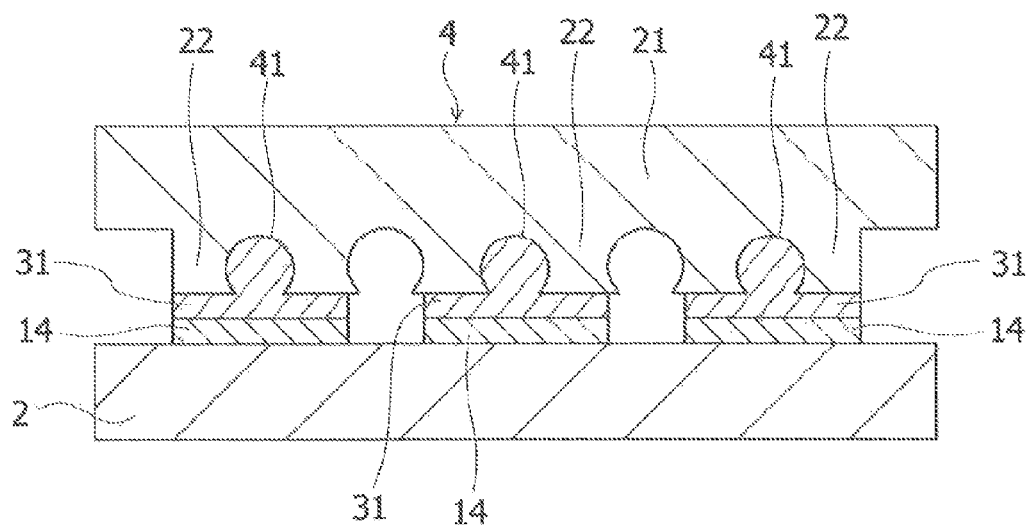
FIG. 19 is an enlarged cross-sectional view illustrating a structure of junction between the package board and each protruding member of the lid.

A description will be made of the shape of each concave portion 41 of the protruding member 22 and the shape of a space between adjacent protruding members 22. In FIG. 13, the shape of each concave portion 41 of the protruding member 22 is quadrangular, and the shape of a space between adjacent protruding members 22 is also quadrangular. In the second embodiment, the concave portion and the space are not limited to these shapes, but may have other shapes. FIGS. 17 to 19 are enlarged cross-sectional views illustrating structures of junction between the package board 2 and each protruding member 22 of the lid 4. The cross-sectional parts of FIGS. 17 to 19 correspond to the dotted line region of FIG. 5, as in the first embodiment. For example, the concave portion 41 of each protruding member 22 may be arch-shaped, and the space between adjacent protruding members 22 may also be arch-shaped, as illustrated in FIG. 17. The lid 4 illustrated in FIG. 17 may be formed using a mold. Alternatively, the protruding members 22 and the concave portions 41 may be formed in the plate-like member 21 by performing wet or dry etching on the plate-like member 21.

For example, the shape of the concave portion 41 of each protruding member 22 may be triangular, and a space between adjacent protruding members 22 may also be triangular, as illustrated in FIG. 18. The lid 4 illustrated in FIG. 18 may be formed using a mold. Alternatively, the protruding members 22 and the concave portions 41 may be formed in the plate-like member 21 by cutting the plate-like member 21. For example, the shape of the concave portion 41 of each protruding member 22 may be circular, and the shape of a space between adjacent protruding members 22 may also be circular, as illustrated in FIG. 19. The lid 4 illustrated in FIG. 19 may be formed by forming the protruding members 22 and the concave portions 41 in the plate-like member 21 by performing wet or dry etching on the plate-like member 21.

Figure 20:
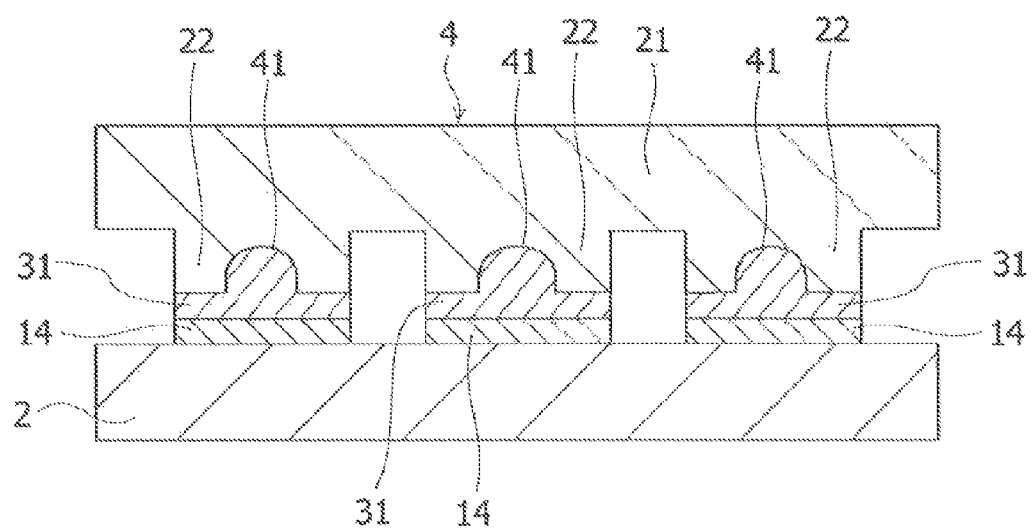
FIG. 20 is an enlarged cross-sectional view illustrating a structure of junction between the package board and each protruding member of the lid.
Figure 21:
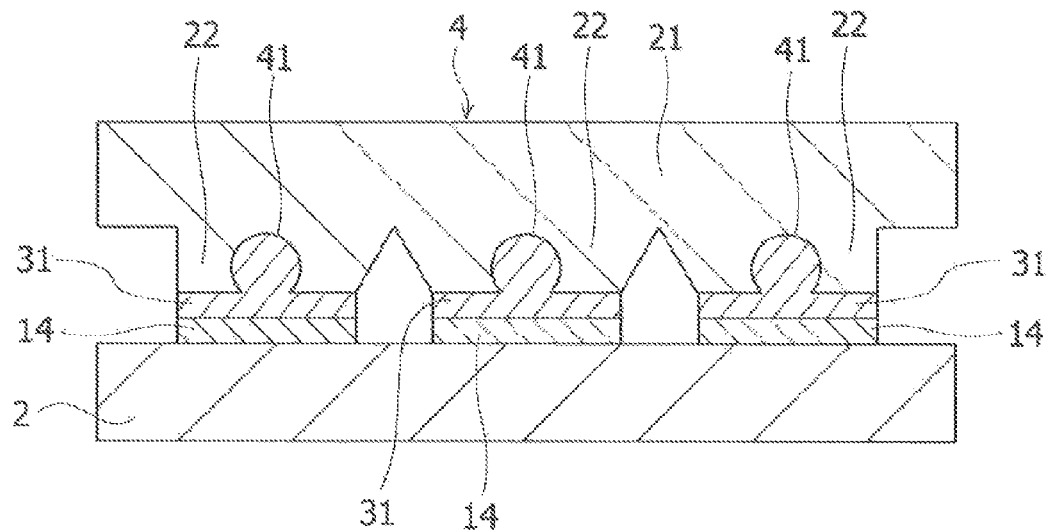
FIG. 21 is an enlarged cross-sectional view illustrating a structure of junction between the package board and each protruding member of the lid.

The shapes of the concave portion 41 of each protruding member 22 in FIG. 13 and FIGS. 17 to 19 and the shapes of a space between adjacent protruding members 22 in FIG. 13 and FIGS. 17 to 19 may be combined with one another. FIGS. 20 and 21 are enlarged cross-sectional views illustrating structures of junction between the package board 2 and each protruding member 22 of the lid 4. The cross-sectional parts of FIGS. 20 and 21 correspond to the dotted line region of FIG. 5, as in the first embodiment. For example, the concave portion 41 of each protruding member 22 may be arch-shaped, and the shape of a space between adjacent protruding members 22 may be quadrangular, as illustrated in FIG. 20. Alternatively, for example, the shape of the concave portion 41 of each protruding member 22 may be circular, and the shape of a space between adjacent protruding members 22 may be triangular, as illustrated in FIG. 21.

Figure 22A:
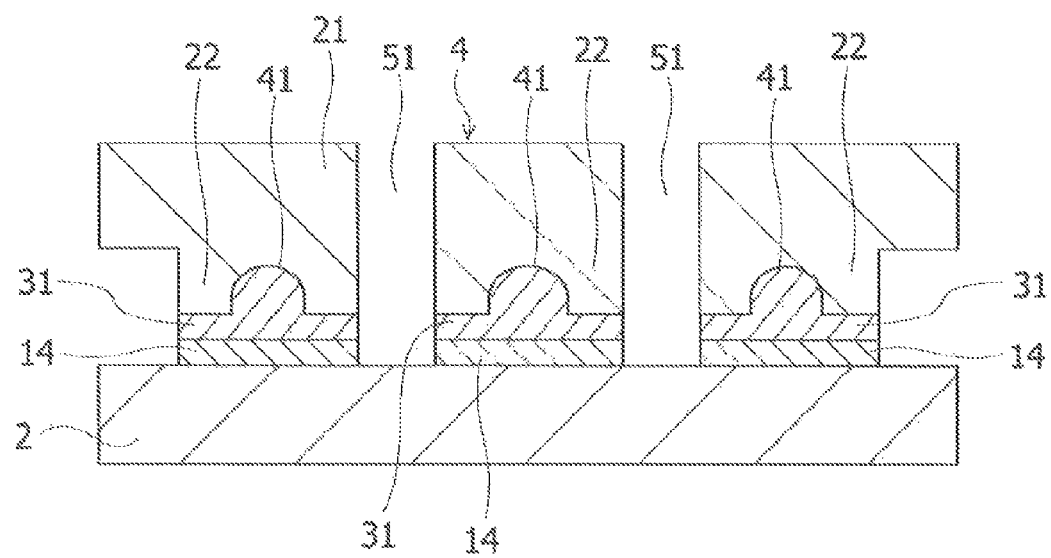
FIG. 22A is an enlarged cross-sectional view illustrating a structure of junction between the package board and each protruding member of the lid.
Figure 22B:
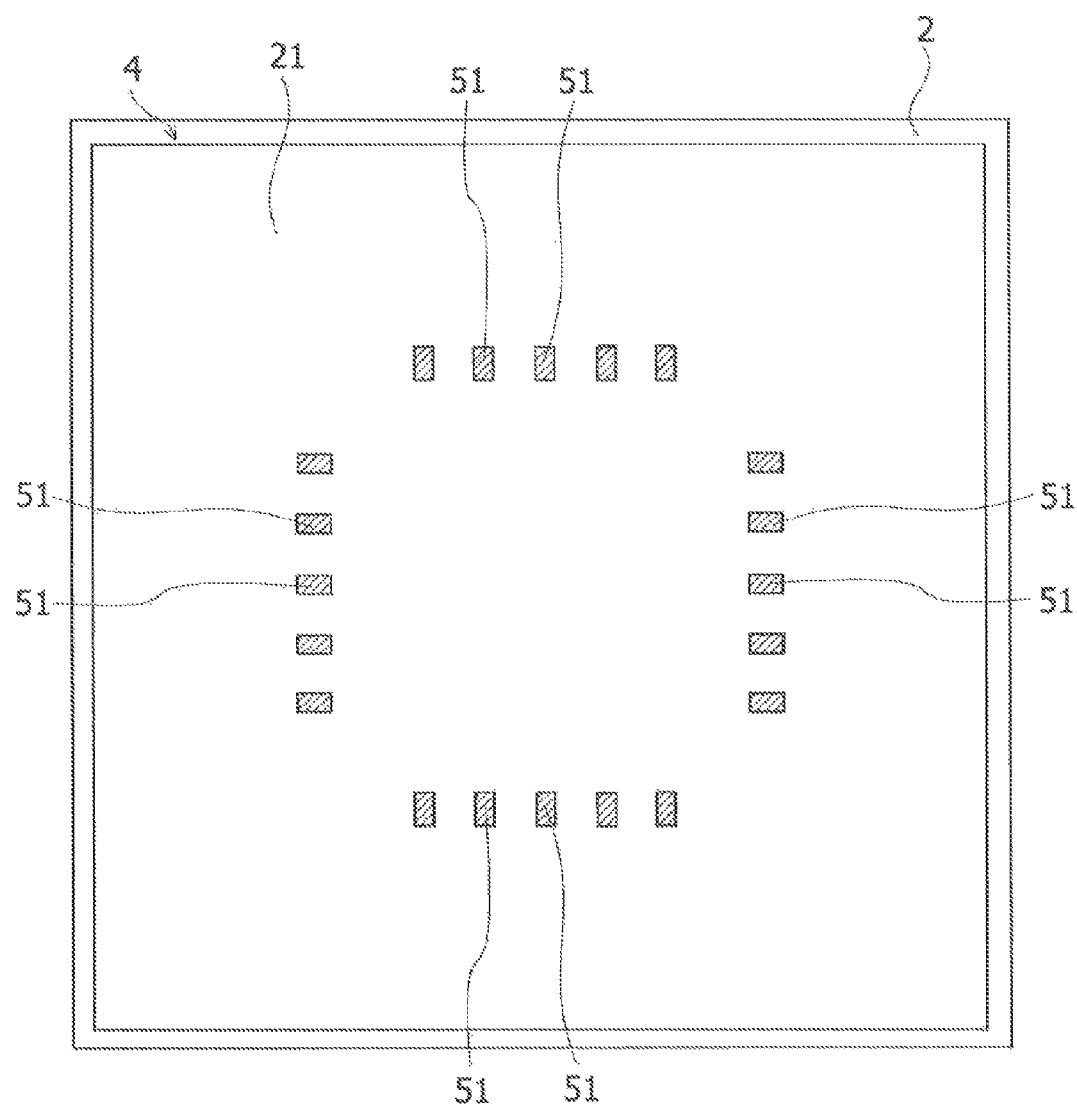
FIG. 22B is a plan view of the semiconductor device.

In addition, the plate-like member 21 may include a plurality of through-holes 51, as illustrated in FIGS. 22A and 22B. FIG. 22A is an enlarged cross-sectional view illustrating a structure of junction between the package board 2 and each protruding member 22 of the lid 4. The cross-sectional part of FIG. 22A corresponds to the dotted line region of FIG. 5, as in the first embodiment. FIG. 22B is a plan view of the semiconductor device 1 taken from above the lid 4. Each through-hole 51 penetrates through the plate-like member 21 and reaches a space between adjacent protruding members 22 in a plan view. Accordingly, the plurality of through-holes 51 is disposed among a plurality of adjacent protruding members 22 in a plan view.

Figure 23:
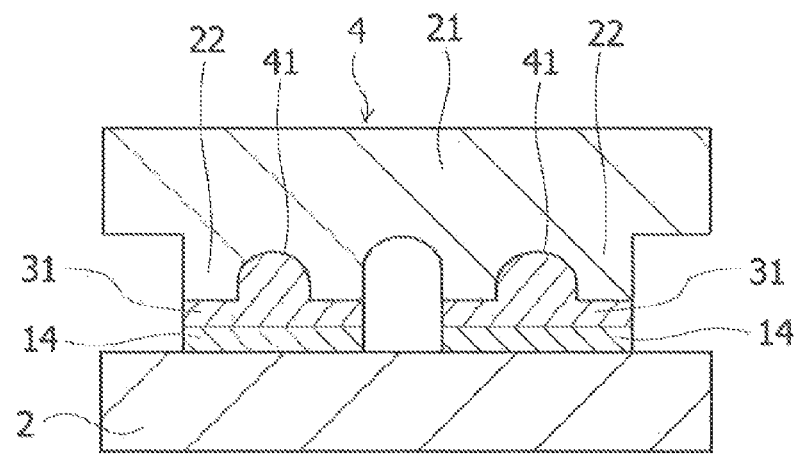
FIG. 23 is an enlarged cross-sectional view illustrating a structure of junction between the package board and each protruding member of the lid.

In the first and second embodiments, three or more electrode pads 14, three or more protruding members 22 and three or more conductive members 31 are arranged in line in a certain direction. The first and second embodiments are not limited to these examples, however. In order to relieve stress in the junction between the package board 2 and the lid 4, the first and second embodiments may include at least one location (space) in which a conductive member 31 is not present. For example, at least two electrode pads 14 are arranged in line in a certain direction, at least two protruding members 22 are arranged in line in the certain direction, and at least two conductive members 31 are arranged in line in the certain direction, as illustrated in FIG. 23. FIG. 23 is an enlarged cross-sectional view illustrating a structure of junction between the package board 2 and each protruding member 22 of the lid 4. Alternatively, for example, at least two electrode pads 14, at least two protruding members 22, and at least two conductive members 31 may be arranged in line along the respective sides of the semiconductor chip 3. Yet alternatively, for example, at least two electrode pads 14, at least two protruding members 22, and at least two conductive members 31 may be arranged in line along one, two or three sides of the semiconductor chip 3. Still alternatively, for example, at least two electrode pads 14, at least two protruding members 22, and at least two conductive members 31 may be arranged in line along opposed two sides or adjacent two sides of the semiconductor chip 3. Intervals (pitches) among the plurality of electrode pads 14, intervals among the plurality of protruding members 22 and intervals among the plurality of conductive members 31 may be uniform, respectively.

<Modified Examples of First and Second Embodiments>

Figure 24:
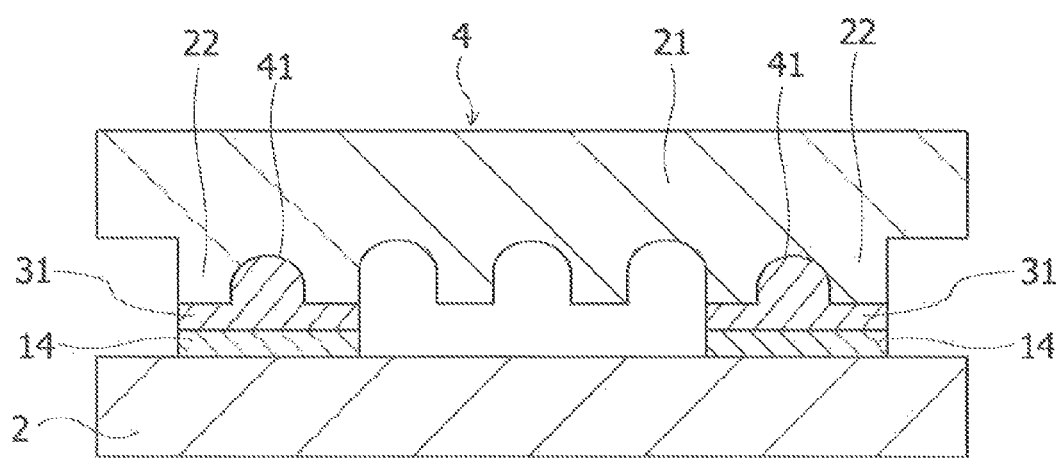
FIG. 24 is an enlarged cross-sectional view illustrating a structure of junction between the package board and each protruding member of the lid.

The semiconductor devices 1 according to the first and second embodiments may be modified as described below. The layout and interval of the conductive members 31 and the layout and interval of spaces among adjacent protruding members 22 may be modified as described below. Two or more spaces may be disposed between adjacent protruding member 22. For example, three spaces may be disposed between adjacent protruding member 22, as illustrated in FIG. 24. FIG. 24 is an enlarged cross-sectional view illustrating a structure of junction between the package board 2 and each protruding member 22 of the lid 4.

Figure 25:
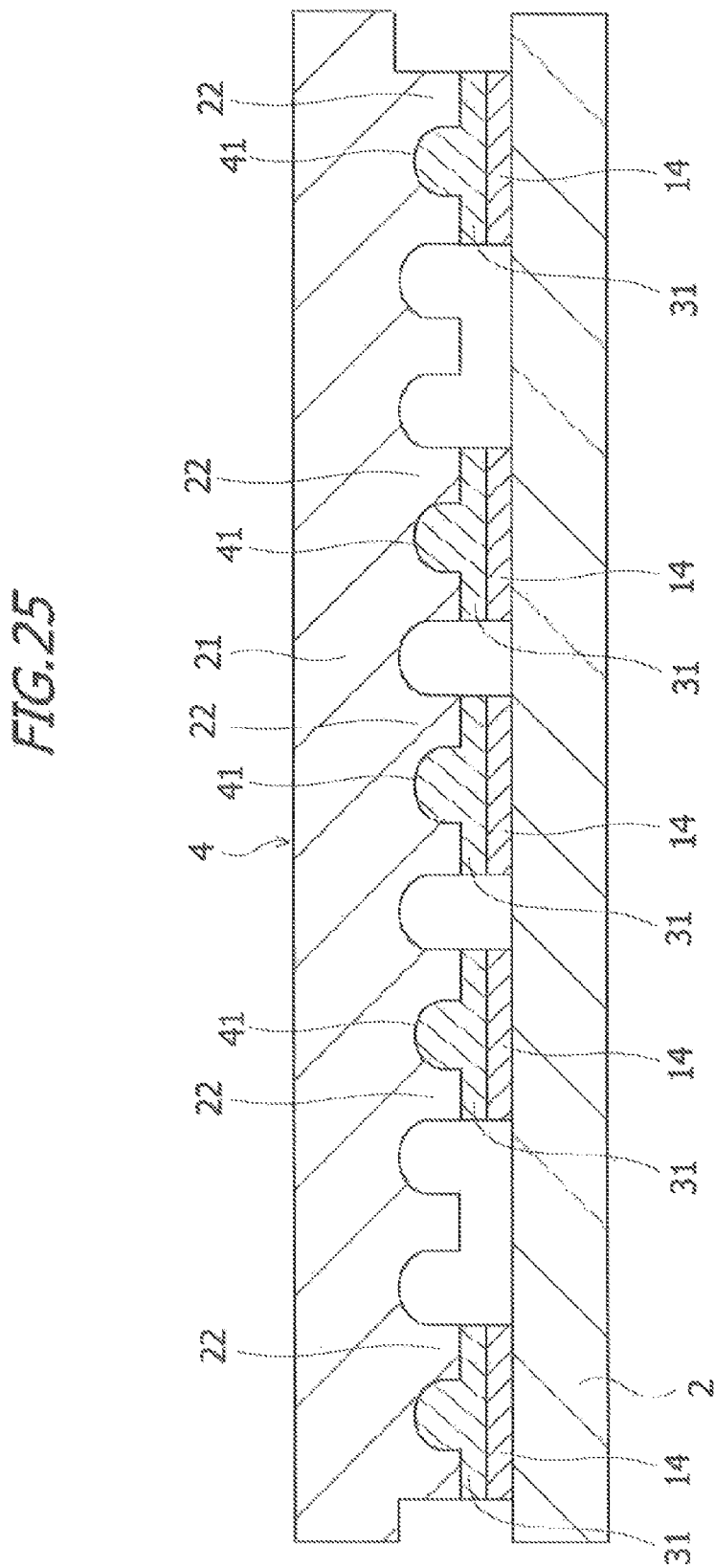
FIG. 25 is an enlarged cross-sectional view illustrating a structure of junction between the package board and each protruding member of the lid.

The conductive members 31 may be made sparse in locations where stress is high. For example, the interval of a plurality of conductive members 31 adjacent to one another in a central part, among a plurality of conductive members 31 arranged in line in a certain direction, may be made shorter, and the interval of a plurality of conductive members 31 adjacent to each other in an edge, among the plurality of conductive members 31 arranged in line in the certain direction, may be made longer, as illustrated in FIG. 25. That is, the intervals of the plurality of conductive members 31 are not uniform but may be varied. FIG. 25 is an enlarged cross-sectional view illustrating a structure of junction between the package board 2 and each protruding member 22 of the lid 4. The interval of a plurality of electrode pads 14 adjacent to one another in a central part, among a plurality of electrode pads 14 arranged in line in a certain direction, may be made shorter, and the interval of a plurality of electrode pads 14 adjacent to each other in an edge, among the plurality of electrode pads 14 arranged in line in the certain direction, may be made longer. That is, the intervals of the plurality of electrode pads 14 are not uniform but may be varied. The interval of a plurality of protruding members 22 adjacent to one another in a central part, among a plurality of protruding members 22 arranged in line in a certain direction, may be made shorter, and the interval of a plurality of protruding members 22 adjacent to each other in an edge, among the plurality of protruding members 22 arranged in line in the certain direction, may be made longer. That is, the intervals of the plurality of protruding members 22 are not uniform but may be varied.

Figure 26:
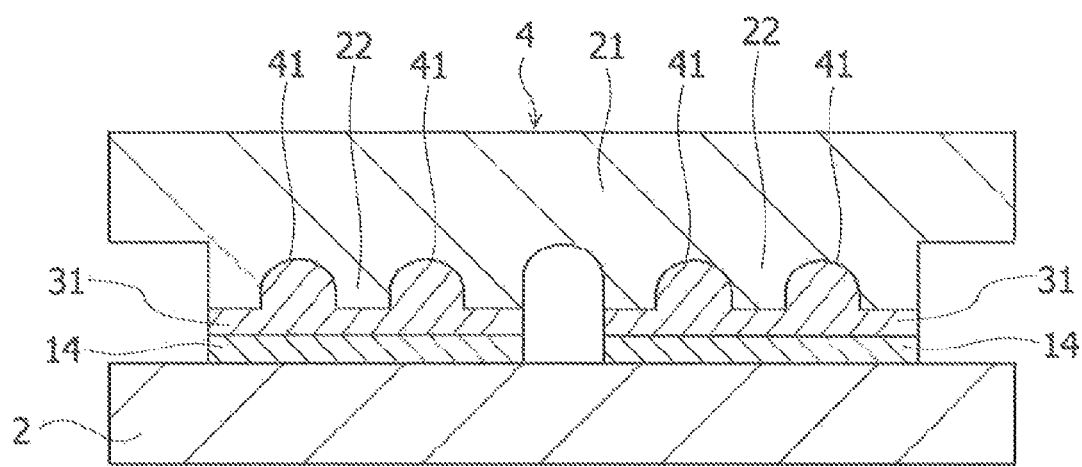
FIG. 26 is an enlarged cross-sectional view illustrating a structure of junction between the package board and each protruding member of the lid.

A plurality of concave portions 41 may be formed in each protruding member 22, as illustrated in FIG. 26. FIG. 26 is an enlarged cross-sectional view illustrating a structure of junction between the package board 2 and each protruding member 22 of the lid 4. For each of the protruding members 22, a plurality of concave portions 41 is formed in line in a certain direction. The direction in which the plurality of concave portions 41 lines up agrees with the direction in which the plurality of protruding members 22 is arranged in line.

In the second embodiment, an example has been discussed in which the extending direction of each concave portion 41 is orthogonal to the direction in which the plurality of protruding members 22 is arranged in line. The second embodiment is not limited to this example, however. The extending direction of each concave portion 41 may agree with the direction in which the plurality of protruding members 22 is arranged in line.

Figure 27A:
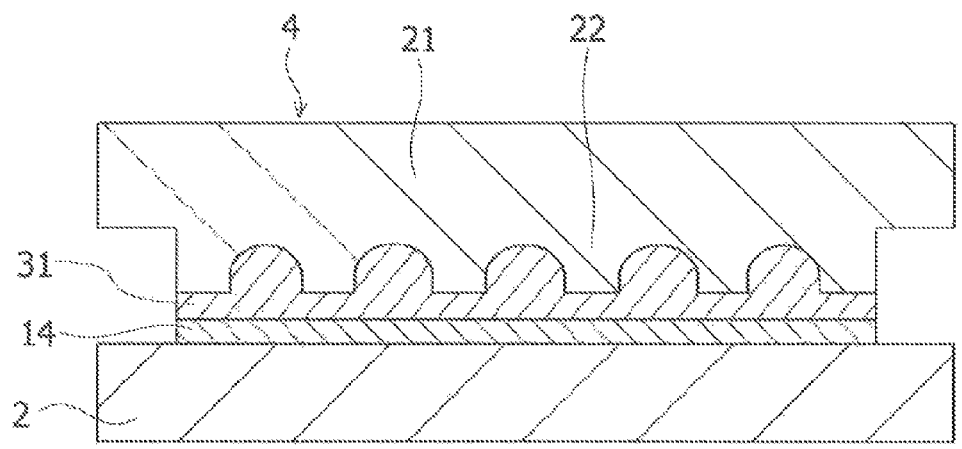
FIG. 27A is an enlarged cross-sectional view illustrating a structure of junction between the package board and each protruding member of the lid.
Figure 27B:
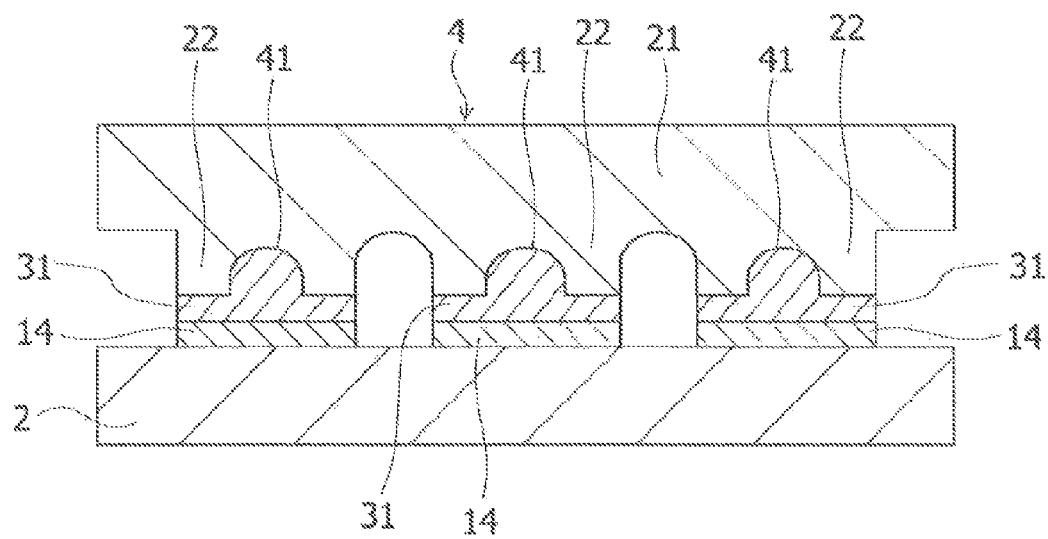
FIG. 27B is an enlarged cross-sectional view illustrating a structure of junction between the package board and each protruding member of the lid.

A description will be made of the reliability evaluation of the semiconductor device 1. Temperature cycling tests were conducted on the semiconductor device 1 to evaluate the reliability of the semiconductor device 1. A temperature cycling test is a durability test in which an evaluation sample is put in a chamber and temperature inside the chamber is cyclically varied to apply a high load to the evaluation sample. As evaluation samples, there were used a structure (structure A) of junction between a package board 2 and each protruding member 22 of a lid 4 illustrated in FIG. 27A and a structure (structure B) of junction between a package board 2 and each protruding member 22 of a lid 4 illustrated in FIG. 27B. FIGS. 27A and 27B are enlarged cross-sectional views illustrating structures of junction between the package board 2 and each protruding member 22 of the lid 4. In the structure A, electrode pads 14, protruding members 22 and conductive members 31 are not separated. In the structure B, each electrode pad 14, each protruding member 22 and each conductive member 31 are disposed separately from one another.

In this evaluation, the evaluation samples were put in the chamber, and tests with a desired number of cycles were conducted at a temperature cycle of −55° C. to 125° C. Thereafter, the evaluation samples were taken out from the chamber to make continuity checks and cross-sectional observations. Using a tester, continuity between a surface of the lid 4 and a ground terminal (solder ball 6 for use as a ground terminal) was checked to observe continuity in the junction between the package board 2 and the lid 4. A cross-section of the conductive member 31 was observed with a metallographic microscope to make a cross-sectional observation of the junction between the package board 2 and the lid 4.

FIG. 28 is a tabular view indicating evaluation results. The continuity checks and cross-sectional observations were made after 1000 and 2000 cycles. As the determining criteria of the continuity checks, evaluation samples were marked "Good" when continuity between the surface of the lid 4 and the ground terminal was superior (without any open-circuited resistance value) and "No Good" when continuity between the surface of the lid 4 and the ground terminal was inferior (with an open-circuited resistance value). As the determining criteria of the cross-sectional observations, evaluation samples were marked "Good" when the ratio of separation in a conductive member 31 was lower than 50%, and "No Good" when the ratio of separation in a conductive member 31 was 50% or higher. As indicated in FIG. 28, excellent results were obtained with regard to the structure B for both continuity checks and cross-sectional observations. Consequently, it has been confirmed, also from this evaluation, that in the semiconductor device 1 having the structure B, separation between each electrode pad 14 and each conductive member 31, separation between each protruding member 22 and each conductive member 31, and cracking in the conductive members 31 are reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions has been described in detail, it should be understood that the various changes, substitutions, and alterations could be made hereto without departing from the spirit and scope of the invention.

What is claimed is:

1. A semiconductor device comprising:
   a substrate;
   a semiconductor chip disposed on the substrate;
   a plurality of electrodes disposed on the substrate separately from one another and arranged so as to surround the semiconductor chip in a plan view;
   a lid that covers the semiconductor chip, the lid including an inner portion and a periphery portion that is outer than the inner portion in a plan view, the lid including a plurality of protruding members that is provided separately from one another, the plurality of protruding members being disposed in the inner portion, whole of the lid being made of metal material having conductivity; and
   conductive members disposed between the plurality of electrodes and the plurality of protruding members disposed in positions opposed to the plurality of electrodes respectively, the conductive members being joined to the plurality of electrodes and the plurality of protruding members respectively.

2. The semiconductor device according to claim 1, wherein the substrate is formed using resin or a material including ceramics.

3. The semiconductor device according to claim 1, wherein
   the lid includes a sidewall member that is disposed so as to surround the plurality of protruding members in a plan view, and
   the sidewall member is disposed along the periphery portion.

4. The semiconductor device according to claim 1, wherein
   each of the protruding members includes a concave portion that is disposed opposed to each of the electrodes, and
   each of the conductive members is buried in each of the concave portions.

5. The semiconductor device according to claim 1, wherein the lid is electrically connected to ground.

6. The semiconductor device according to claim 1, wherein the lid and the protruding members include same metal.

7. The semiconductor device according to claim 1, comprising a passive component provided on the substrate and disposed between the periphery portion and one of the plurality of protruding members in a plan view.

8. The semiconductor device according to claim 4, wherein the plurality of the protruding members are arranged in a first direction, and
   each of the concave portions is located extending to a second direction that is orthogonal to the first direction.

9. The semiconductor device according to claim 1, wherein intervals of the plurality of protruding members are varied.

10. The semiconductor device according to claim 1, wherein the lid includes a through-hole that penetrates through the lid, and
    the through-hole is disposed between one of the protruding members and the other of the protruding members in a plan view.

11. A manufacturing method of a semiconductor device comprising:
    providing conductive members on a plurality of electrodes provided on a substrate and a plurality of protruding members of a lid, the lid including an inner portion and a periphery portion that is outer than the inner portion, the plurality of protruding members being located in the inner portion in a plan view, the plurality of electrodes being arranged so as to surround a semiconductor chip provided on the substrate in a plan view, the plurality of electrodes being disposed separately from one another, whole of the lid being made of metal material having conductivity;
    disposing the substrate and the lid, so that the lid covers the semiconductor chip, and so that the plurality of electrodes and the plurality of protruding members face each other; and
    joining the conductive members to the plurality of electrodes and the plurality of protruding members respectively.

12. The manufacturing method of a semiconductor device according to claim 11, wherein the substrate is formed using resin or a material including ceramics.

13. The manufacturing method of a semiconductor device according to claim 11, wherein the lid includes a sidewall member that is disposed so as to surround the plurality of protruding members in a plan view, and
    the sidewall member is disposed along the periphery portion in a plan view.

14. The manufacturing method of a semiconductor device according to claim 11, wherein
    each of the protruding members includes a concave portion that is disposed opposed to each of the electrodes, and
    the placing the conductive members includes burying each of the conductive members in each of the concave portions.

15. The manufacturing method of a semiconductor device according to claim 11, wherein the lid is electrically connected to ground.

16. The manufacturing method of a semiconductor device according to claim 11, wherein the lid and the plurality of protruding members including the same metal.

17. The manufacturing method of a semiconductor device according to claim 11, wherein the substrate includes a passive component provided on the substrate, and the passive component is disposed between the periphery portion and one of the plurality of protruding members in a plan view.

18. The manufacturing method of a semiconductor device according to claim 14, wherein at least some of the plurality of protruding members are arranged in a first direction, and
each of the concave portions is located extending to a second direction orthogonal to the first direction.

19. The manufacturing method of a semiconductor device according to claim 11, wherein intervals of the plurality of protruding members are varied.

20. The manufacturing method of a semiconductor device according to claim 11, wherein the lid includes a through-hole penetrating through the lid, and
the through-hole is disposed between one protruding members and other of the protruding members in a plan view.

* * * * *